(12) United States Patent
Hamada

(10) Patent No.: US 9,819,363 B2
(45) Date of Patent: Nov. 14, 2017

(54) DECODING DEVICE AND METHOD, INFORMATION TRANSMISSION SYSTEM, AND NON-TRANSITORY COMPUTER READABLE MEDIUM

(71) Applicant: FUJI XEROX CO., LTD., Tokyo (JP)

(72) Inventor: Tsutomu Hamada, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 26 days.

(21) Appl. No.: 14/991,423

(22) Filed: Jan. 8, 2016

(65) Prior Publication Data

US 2017/0077956 A1 Mar. 16, 2017

(30) Foreign Application Priority Data

Sep. 10, 2015 (JP) ................................ 2015-178605

(51) Int. Cl.
| | |
|---|---|
| *H03M 13/00* | (2006.01) |
| *H03M 13/29* | (2006.01) |
| *H04L 1/00* | (2006.01) |
| *H04L 25/49* | (2006.01) |

(52) U.S. Cl.
CPC ...... *H03M 13/2906* (2013.01); *H04L 1/0041* (2013.01); *H04L 1/0045* (2013.01); *H04L 1/0063* (2013.01); *H04L 25/4908* (2013.01)

(58) Field of Classification Search
CPC . H03M 13/2906; H04L 1/0041; H04L 1/0045
See application file for complete search history.

(56) References Cited

U.S. PATENT DOCUMENTS

| | | | | |
|---|---|---|---|---|
| 5,404,495 | A * | 4/1995 | Yoneda | G06F 11/1004 714/52 |
| 6,487,686 | B1 * | 11/2002 | Yamazaki | H04J 3/1611 370/241 |
| 6,735,736 | B2 * | 5/2004 | Korall | H04J 3/14 714/755 |
| 7,181,485 | B1 * | 2/2007 | Lau | G06F 1/14 709/203 |
| 7,243,296 | B2 * | 7/2007 | Christensen | H03M 13/098 714/758 |

(Continued)

FOREIGN PATENT DOCUMENTS

| | | |
|---|---|---|
| JP | 2007-533184 A | 11/2007 |
| JP | 2008-294757 A | 12/2008 |

(Continued)

*Primary Examiner* — Esaw Abraham
(74) *Attorney, Agent, or Firm* — Sughrue Mion, PLLC

(57) ABSTRACT

A decoding device includes a reception unit and a correction unit. The reception unit receives data obtained by segmenting transmit data into multiples of a predetermined number of bits, calculating parity data for each bit position in a segment, attaching the parity data to the transmit data, and performing bit number conversion coding on the transmit data so that a ratio of a frequency of occurrence of a first code and a frequency of occurrence of a second code becomes a predetermined ratio. The correction unit corrects a 1-bit error in the received data on a basis of a decoding error occurring in the bit number conversion coding performed on the data received by the reception unit, and a parity error detected according to the parity data from the received data obtained by decoding the data.

8 Claims, 24 Drawing Sheets

(56) References Cited

U.S. PATENT DOCUMENTS

| | | | | |
|---|---|---|---|---|
| 7,290,202 B2* | 10/2007 | Kang | ...................... | H03M 5/02 |
| | | | | 341/102 |
| 7,302,188 B2* | 11/2007 | Sugihara | .......... | H04B 10/25133 |
| | | | | 398/147 |
| 7,685,496 B2* | 3/2010 | Toyoda | ............... | H04J 14/0226 |
| | | | | 714/700 |
| 7,694,204 B2* | 4/2010 | Schmidt | ................ | H04L 1/0045 |
| | | | | 714/758 |
| 8,078,938 B2* | 12/2011 | Kawabata | ........... | G06F 11/1008 |
| | | | | 714/763 |
| 9,094,151 B2* | 7/2015 | Perez De Aranda Alonso | .................. | H04B 10/25 |

FOREIGN PATENT DOCUMENTS

| | | | |
|---|---|---|---|
| JP | 4920189 B2 | 4/2012 |
| WO | 2004/001976 A2 | 12/2003 |
| WO | 2005/099153 A1 | 10/2005 |

\* cited by examiner

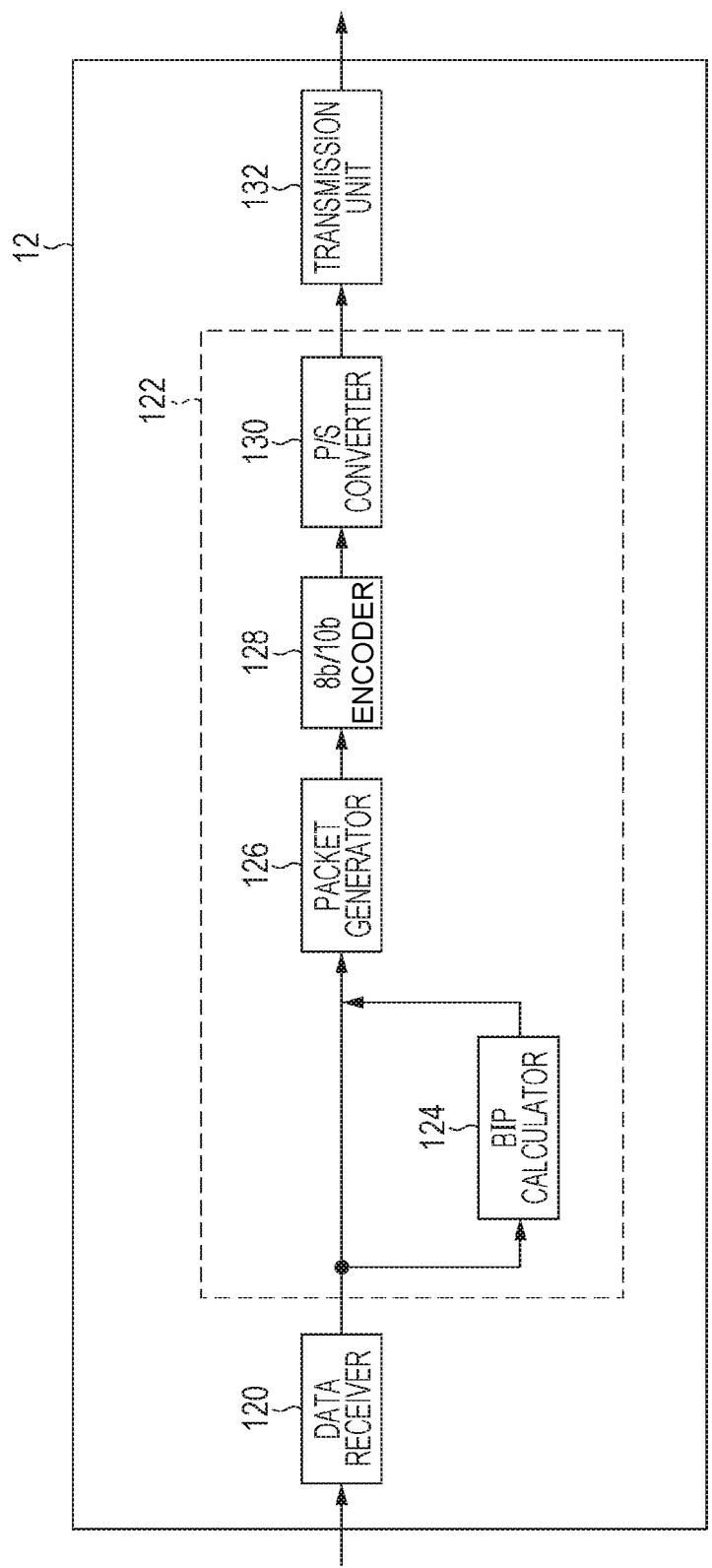

PACKET STRUCTURE

| TRANSMIT | RECEIVE | Table | RD | Error |
|---|---|---|---|---|
| A+ | B+ | 0 | 0 | 0 |
|  | B− | 0 | 1 | 1 |
|  | NotInTable | 1 | − | 1 |
| C | B+ | 0 | 0 | 0 |
|  | B− | 0 | 0 | 0 |
|  | NotInTable | 1 | − | 1 |
| A− | B+ | 0 | 1 | 1 |
|  | B− | 0 | 0 | 0 |
|  | NotInTable | 1 | − | 1 |
| B+ | A+ | 0 | 0 | 0 |
|  | C | 0 | 0 | 0 |
|  | A− | 0 | 1 | 1 |
|  | NotInTable | 1 | − | 1 |
| B− | A+ | 0 | 1 | 1 |
|  | C | 0 | 0 | 0 |
|  | A− | 0 | 0 | 0 |
|  | NotInTable | 1 | − | 1 |

FIG. 8

| TRANSMITTED PATTERN | | RECEIVED PATTERN 1 | | RECEIVED PATTERN 2 | |
|---|---|---|---|---|---|
| + | A+ | + | A+ | + | A+ |
| + | B+ | + | B+ | + | B+ |
| − | B− | − | B− | − | B− |
| + | C | + | C | + | C |
| + | A+ | + | B− | + | B+ |
| + | B+ | + | B+ | − | B+ |
| − | A− | − | A− | − | A− |
| − | A− | − | A− | − | A− |
| − | C | − | C | − | C |
| − | B− | − | B− | − | B− |
| + | C | + | C | + | C |
| + | B+ | + | B+ | + | B+ |
| − | B− | − | B− | − | B− |
| + | C | + | C | + | C |
| + | A+ | + | A+ | + | A+ |
| + | B+ | + | B+ | + | B+ |

FIG. 10

| TRANSMITTED PATTERN | | RECEIVED PATTERN 1 | | RECEIVED PATTERN 2 | |
|---|---|---|---|---|---|
| + | A+ | + | A+ | + | A+ |
| + | B+ | + | B+ | + | B+ |
| − | B− | − | A+ | − | A− |
| + | C  | + | C  | − | C  |
| + | A+ | + | A+ | − | A+ |
| + | B+ | + | B+ | + | B+ |
| − | A− | − | A− | − | A− |
| − | A− | − | A− | − | A− |
| − | C  | − | C  | − | C  |
| − | B− | − | B− | − | B− |
| + | C  | + | C  | + | C  |
| + | B+ | + | B+ | + | B+ |
| − | B− | − | B− | − | B− |
| + | C  | + | C  | + | C  |
| + | A+ | + | A+ | + | A+ |
| + | B+ | + | B+ | + | B+ |

FIG. 11A

TRANSMITTED PATTERN

| A | B | A | C |
|---|---|---|---|
| A | C | A | A |
| . | . | . | . |
| . | . | . | . |
| . | . | . | . |
| B | C | A | B |
| P1 | P2 | P3 | P4 |

8 BITS

FIG. 11B

RECEIVED PATTERN

| A+ | B+ | B− | C |
|---|---|---|---|
| A+ | C | A+ | A+ |
| . | . | . | . |
| . | . | . | . |
| . | . | . | . |
| B+ | C | A+ | B+ |
| (P1)− | (P2)+ | (P3)− | (P4)+ |

FIG. 11C

| | P1 | P2 | P3 | P4 |
|---|---|---|---|---|
| RECEIVED PARITY → | P1 | P2 | P3 | P4 |
| CALCULATED PARITY → | P1 | P2 | P3' | P4 |

FIG. 12

|       | +0x00 | +0x01 | +0x02 | +0x03 |
|-------|-------|-------|-------|-------|
| 0x00  | A+    | B+    | A−    | C     |
| 0x04  | C     | C     | A+    | C     |
| 0x08  | C     | B+    | C     | B−    |
| .     | .     | .     | .     | .     |
| .     | .     | .     | .     | .     |
| .     | .     | .     | .     | .     |
| 0x70  | B+    | C     | A+    | B+    |
| 0x7C  | P1    | P2    | P3    | P4    |
| Calc. | P1'   | P2    | P3    | P4    |

FIG. 15A  RECEIVED PATTERN 1

| A+ | B+ | A− | C  |
|----|----|----|----|
| C  | C  | A+ | C  |
| C  | B+ | C  | B− |
| .  | .  | .  | .  |
| .  | .  | .  | .  |
| .  | .  | .  | .  |
| B+ | C  | A+ | B+ |
| P1 | P2 | P3 | P4 |

FIG. 15B  RECEIVED PATTERN 2

| A+ | B+ | A− | C  |
|----|----|----|----|
| C  | C  | A+ | C  |
| C  | B+ | C  | B− |
| .  | .  | .  | .  |
| .  | .  | .  | .  |
| .  | .  | .  | .  |
| B+ | C  | A+ | B+ |
| P1 | P2 | P3 | P4 |

FIG. 15C  LIST OF C CODES

| D03.1 | D17.1 | D03.2 | D17.2 | D03.5 | D17.5 | D03.6 | D17.6 |
|-------|-------|-------|-------|-------|-------|-------|-------|
| D05.1 | D18.1 | D05.2 | D18.2 | D05.5 | D18.5 | D05.6 | D18.6 |
| D06.1 | D19.1 | D06.2 | D19.2 | D06.5 | D19.5 | D06.6 | D19.6 |
| D09.1 | D20.1 | D09.2 | D20.2 | D09.5 | D20.5 | D09.6 | D20.6 |
| D10.1 | D21.1 | D10.2 | D21.2 | D10.5 | D21.5 | D10.6 | D21.6 |
| D11.1 | D22.1 | D11.2 | D22.2 | D11.5 | D22.5 | D11.6 | D22.6 |
| D12.1 | D25.1 | D12.2 | D25.2 | D12.5 | D25.5 | D12.6 | D25.6 |
| D13.1 | D26.1 | D13.2 | D26.2 | D13.5 | D26.5 | D13.6 | D26.6 |
| D14.1 | D28.1 | D14.2 | D28.2 | D14.5 | D28.5 | D14.6 | D28.6 |

FIG. 19

| TRANSMITTED PATTERN | | | | | | | | |
|---|---|---|---|---|---|---|---|---|
| 8 BITS | A | B | B | C | C | C | A | C |
| 10 BITS | A+ | B+ | B− | C | C | C | K23.7+ | A+ |

| RECEIVED PATTERN | | | | | | | | |
|---|---|---|---|---|---|---|---|---|
| 10 BITS | A+ | B+ | A− | C | C | C | K23.7+ | A+ |
| 8 BITS | A | B | A | C | C | C | A | C |

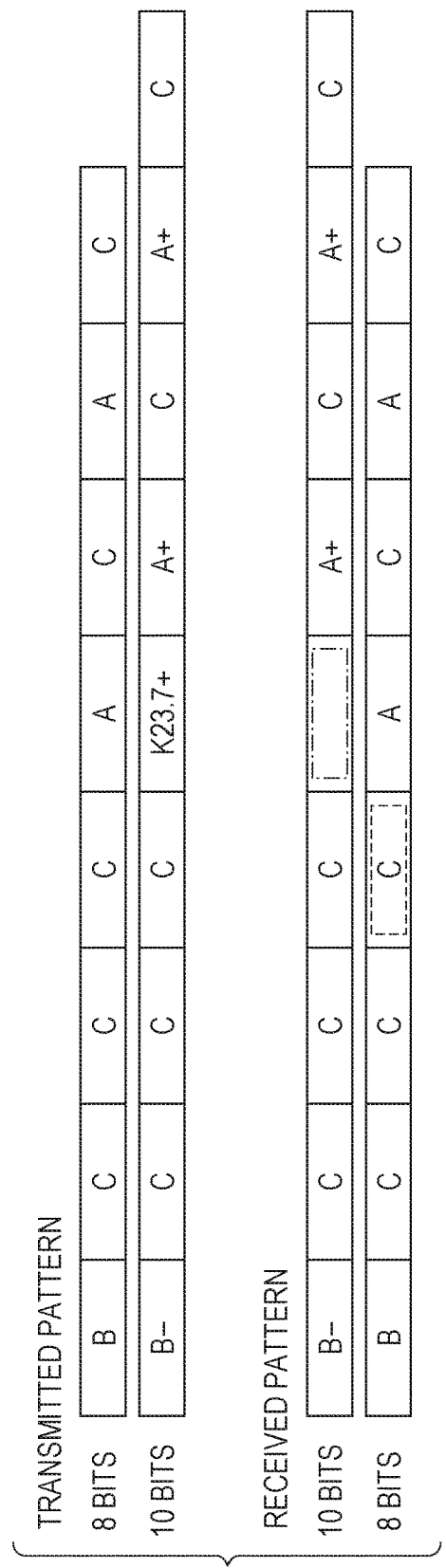

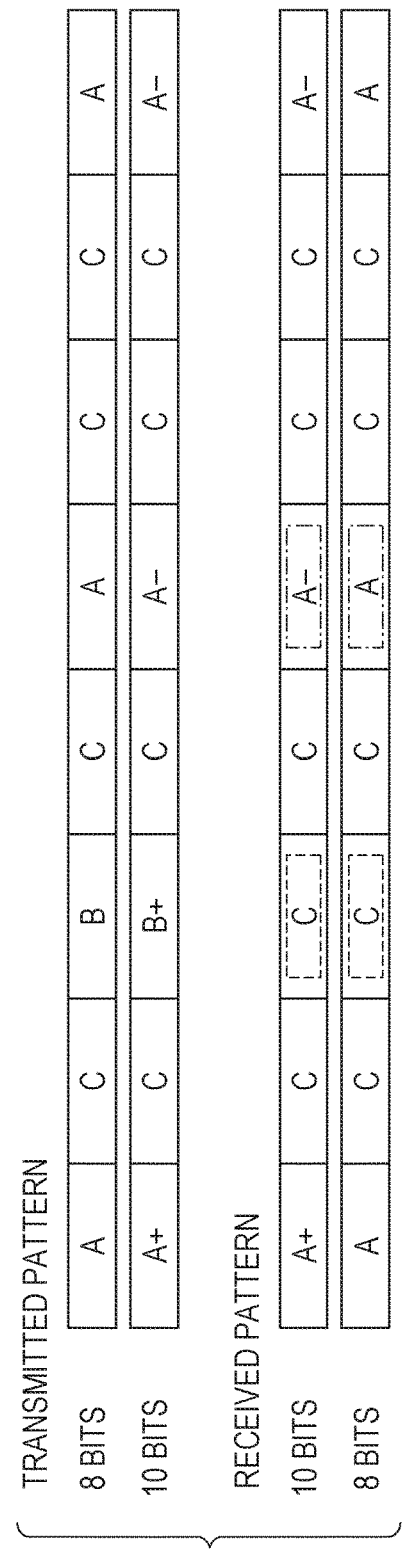
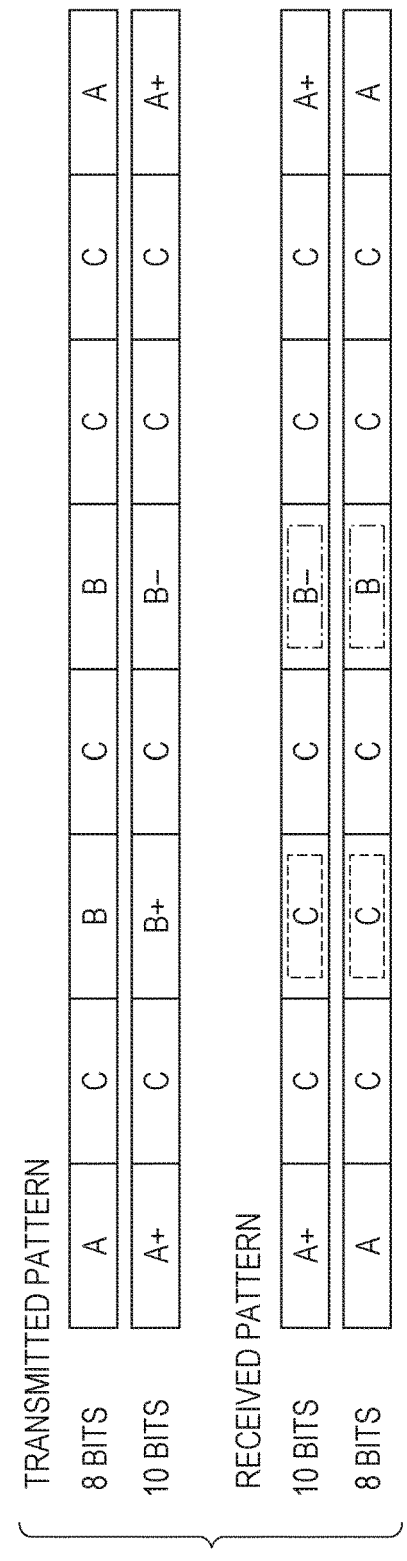

DECODING DEVICE AND METHOD, INFORMATION TRANSMISSION SYSTEM, AND NON-TRANSITORY COMPUTER READABLE MEDIUM

CROSS-REFERENCE TO RELATED APPLICATIONS

This application is based on and claims priority under 35 USC 119 from Japanese Patent Application No. 2015-178605 filed Sep. 10, 2015.

BACKGROUND

Technical Field

The present invention relates to a decoding device and method, an information transmission system, and a non-transitory computer readable medium.

SUMMARY

According to an aspect of the invention, there is provided a decoding device including a reception unit and a correction unit. The reception unit receives data obtained by segmenting transmit data into multiples of a predetermined number of bits, calculating parity data for each bit position in a segment, attaching the parity data to the transmit data, and performing bit number conversion coding on the transmit data so that a ratio of a frequency of occurrence of a first code and a frequency of occurrence of a second code becomes a predetermined ratio. The correction unit corrects a 1-bit error in the received data on a basis of a decoding error occurring in the bit number conversion coding performed on the data received by the reception unit, and a parity error detected according to the parity data from the received data obtained by decoding the data.

BRIEF DESCRIPTION OF THE DRAWINGS

Exemplary embodiments of the present invention will be described in detail based on the following figures, wherein:

FIG. 2 is a block diagram illustrating an example of a configuration of an encoding device according to the first exemplary embodiment;

FIG. 8 is a diagram illustrating an example of a case in which a bit error occurs;

FIG. 10 is a diagram illustrating an example of a case in which a bit error occurs;

FIGS. 11A to 11C are diagrams for explaining the correction of a bit error;

FIG. 12 is a diagram for explaining a specific example of bit error correction;

FIGS. 15A to 15C are diagrams for explaining the correction of a 1-bit error in a case of consecutive "C" symbols;

FIG. 19 is a diagram illustrating an example of a case in which an error occurs in an "A−" symbol;

FIG. 20 is a diagram illustrating an example of a case in which an error occurs in a K code;

FIGS. 21A and 21B are diagrams illustrating an example of a case in which a bit error occurs, and there are three consecutive "C" symbols;

DETAILED DESCRIPTION

Hereinafter, exemplary embodiments of the present invention will be described with reference to the drawings. Note that the following describes a case of applying the present invention to an information transmission system in which information is transmitted and received between two devices by serial transmission.

<Information Transmission System>

Figure 1:
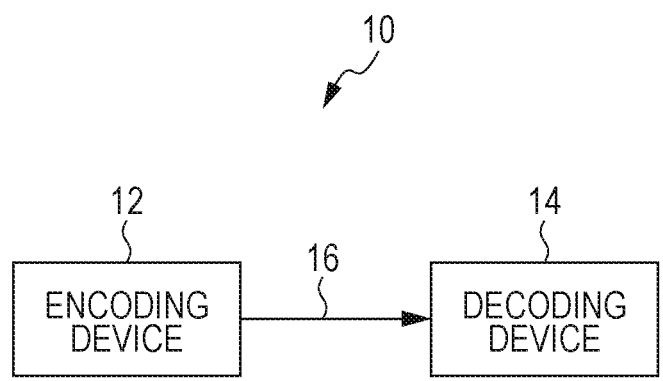
FIG. 1 is a schematic diagram illustrating an example of a configuration of an information transmission system according to a first exemplary embodiment of the present invention.

First, a schematic configuration of an information transmission system according to an exemplary embodiment of the present invention will be described. FIG. 1 is a schematic diagram illustrating an example of a configuration of an information transmission system according to an exemplary embodiment of the present invention. As illustrated in FIG. 1, the information transmission system 10 is equipped with an encoding device 12 that transmits information and a decoding device 14 that receives information.

The encoding device 12 and the decoding device 14 are connected by a transmission line 16. The transmission line 16 is a transmission line for the serial transmission of information from the encoding device 12 to the decoding device 14.

(Encoding Device)

Next, a configuration of the encoding device 12 will be described. FIG. 2 is a block diagram illustrating an example of a configuration of an encoding device. As illustrated in FIG. 2, the encoding device 12 is equipped with a data receiver 120, a converter 122, and a transmission unit 132. The encoding device 12 is implemented by an integrated circuit (IC) such as a field-programmable gate array (FPGA), an application-specific integrated circuit (ASIC), or a gate array. Also, each of the above functional units provided in the encoding device 12 may also be realized by a computer equipped with a central processing unit (CPU), random access memory (RAM), read-only memory (ROM), and the like, in which each function in each functional unit is configured to be executed by having the CPU execute a program stored in the ROM.

The data receiver 120 receives transmit data in parallel format. The present exemplary embodiment describes, as an example, the case of using transmit data in an 8-bit parallel format.

The converter 122 acquires transmit data in parallel format received by the data receiver 120. Subsequently, the converter 122 attaches parity data to the acquired transmit data, and encodes the transmit data so that direct current (DC) balance is maintained. The converter 122 is equipped with a BIP calculator 124, a packet generator 126, an 8b/10b encoder 128, and a parallel-to-serial (P/S) converter 130.

The BIP calculator 124 acquires transmit data received by the data receiver 120, and by following a bit-interleaved parity (BIP) scheme, divides the acquired transmit data into individual segments having a predetermined number of bits, and calculates parity data for each bit position in a segment.

Figure 3A:
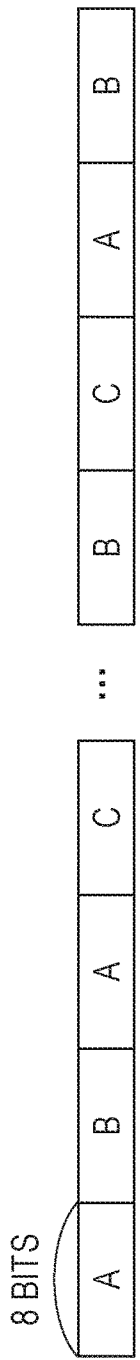
FIGS. 3A and 3B are explanatory diagrams for explaining the calculation of parity data.
Figure 3B:
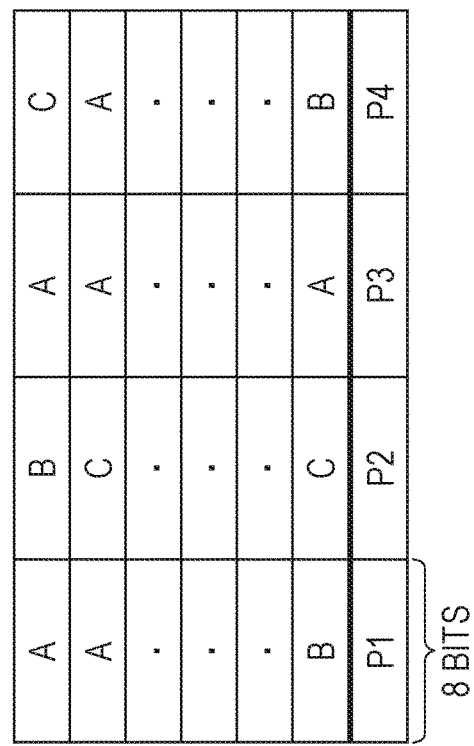

FIGS. 3A and 3B illustrate explanatory diagrams for explaining the calculation of parity data. FIG. 3A illustrates an example of transmit data. Also, FIG. 3B illustrates an example of transmit data segmented every 32 bits, and parity data calculated for each bit position in a segment. Note that A, B, C, and D illustrated in FIGS. 3A and 3B represent 8-bit symbol patterns. The symbols A, B, C, and D will be discussed in detail later.

When transmit data as illustrated in FIG. 3A is acquired, the BIP calculator 124, as illustrated in FIG. 3B, divides and maps the transmit data in two dimensions in columns of 4×N symbols, such as a first, second, third, and fourth column, for example, and calculates P1 as the parity of the first column from the 1st bit to the 8th bit, P2 as the parity of the second column from the 9th bit to the 16th bit, P3 as the parity of the third column from the 17th bit to the 24th bit, and P4 as the parity of the fourth column from the 25th bit to the 32nd bit. Subsequently, the BIP calculator 124 outputs the calculated parity data.

The packet generator 126 generates a packet from the transmit data received by the data receiver 120 and the parity data output by the BIP calculator 124.

Figure 4:
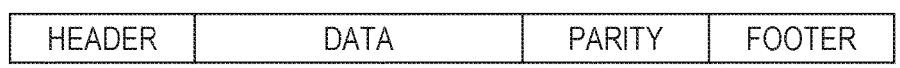
FIG. 4 is an explanatory diagram for explaining a packet.

Specifically, as illustrated in FIG. 4, the packet generator 126 generates a packet by attaching the parity data output by the BIP calculator 124 as well as a header and a footer to the transmit data received by the data receiver 120.

The 8b/10b encoder 128 encodes the packet generated by the packet generator 126 according to a predetermined coding scheme, and thereby converts the number of bits.

Specifically, the 8b/10b encoder 128 performs bit number conversion coding on the packet so that the ratio of the frequency of occurrence of a first code and the frequency of occurrence of a second code becomes a predetermined ratio.

The present exemplary embodiment describes, as an example, the case of using "0" as the first code, using "1" as the predetermined second code, and converting the number of bits according to an 8b/10b coding scheme.

Specifically, the 8b/10b encoder 128 converts 8-bit information to 10-bit information by following an 8b/10b coding scheme. In an 8b/10b coding scheme, a predetermined conversion table is used to convert 8-bit symbols to 10-bit symbols. Also, in an 8b/10b coding scheme, the symbols in which to convert are selected so that there is an equal balance of 1s and 0s in the converted data.

In an 8b/10b coding scheme, 8-bit symbols are converted to 10-bit symbols so that direct current (DC) balance is maintained. DC balance refers to the ratio of the number of 1s and 0s. Additionally, maintaining DC balance refers to keeping the ratio of the frequency of occurrence of 1 and the frequency of occurrence of 0 at a predetermined ratio, and may refer to keeping an equal ratio, for example. For example, DC-balanced data is generated by mapping bits so that when observing the data along the transmission direction, there are no consecutive runs of 1s or 0s equal to or greater than a predetermined number.

Figure 5:
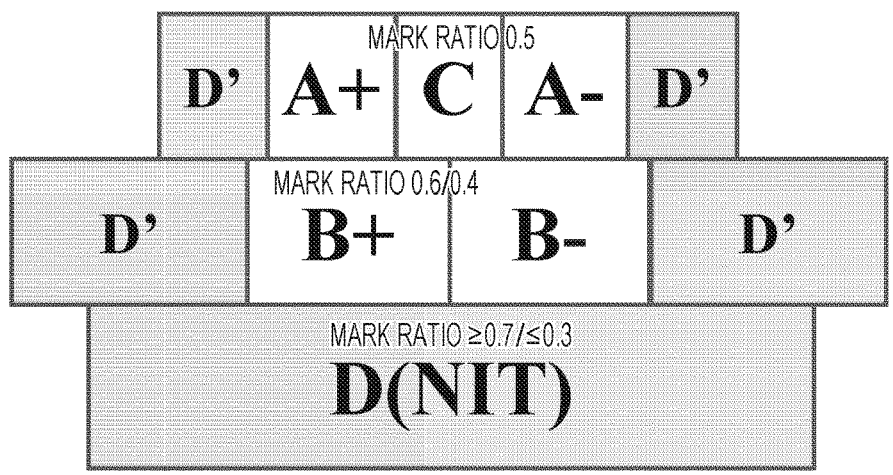
FIG. 5 is a diagram for explaining changes in symbols when a 1-bit error occurs.

FIG. 5 illustrates a diagram for explaining an 8b/10b coding scheme. In 8b/10b coding, in order to ensure DC balance, 8-bit symbols are laid out over 10 bits to yield a mark ratio from 0.4 to 0.6, and in addition, inverted codes are used so that codes with a mark ratio of 0.6 are not consecutive. Furthermore, in 8b/10b coding, codes are selected so that the run length is 5 or less. Herein, run length refers to the number of bits over which the same code appears consecutively.

For example, 10-bit symbols coded by 8b/10b coding may be classified as illustrated in FIG. 5.

As illustrated in FIG. 5, 8b/10b coding is configured to include "B+" with a mark ratio of 0.6, "B−" with a mark ratio of 0.4, or "A+", "C", or "A−" with a mark ratio of 0.5. However, among the possible 10-bit patterns, there exist patterns which have a mark ratio from 0.4 To 0.6, but do not represent codes. For example, the pattern "0000011111" having a mark ratio of 0.5 does not exist in the table of 8b/10b codes (referred to as Not in Table (NIT)), and thus is designated "D'". Additionally, patterns having a mark ratio of 0.4 or 0.6 with a run length of 6 likewise do not exist in the table of 8b/10b codes (NIT), and thus are designated "D'".

Herein, "C" is assigned as a code having a mark ratio of 0.5 and for which "+" and "−" are the same. "B+" is the code obtained by partially or fully inverting the bits in "B−", while "A+" is the code obtained by partially or fully inverting the bits in "A−". "B+" and "B−" are controlled so as not to be transmitted consecutively.

Specifically, in 8b/10b coding, a running disparity (RD) is controlled to be either "+1" or "−1". When the running disparity RD is "+1", an "A+", "B+", or "C" symbol is transmitted, whereas when the running disparity RD is "−1", an "A−", "B−", or "C" symbol is transmitted.

Since the mark ratio of "A+", "C", or "A−" is 0.5, when "A+", "C", or "A−" is transmitted, the RD does not change and remains the same in the next piece of data. On the other hand, since "B+" or "B−" has a mark ratio of 0.4 or 0.6, when "B+" or "B−" is transmitted, the running disparity becomes RD'=−RD in the next piece of data. Herein, RD represents the current running disparity, while RD' represents the running disparity of the next piece of data.

In this way, in an 8b/10b coding scheme, an encoding rule that selects output bits corresponding to minus or output bits corresponding to plus depending on the value of the previous RD is used, thereby keeping the number of 0s and 1s in the output bit sequence equal or nearly equal.

The parallel-to-serial (P/S) converter 130 converts the 10-bit data in parallel format converted by the 8b/10b encoder 128 to a serial bit sequence by parallel-to-serial (P/S) conversion. In the present exemplary embodiment, after successively performing 8b/10b conversion on packets having parity data, a header, and a footer attached to 8×n bits of data, the data is subjected to parallel-to-serial conversion and transmitted by the transmission unit 132 discussed later.

The transmission unit 132 outputs data in serial format converted by the parallel-to-serial (P/S) converter 130 to the transmission line 16.

(Decoding Device)

Figure 6:
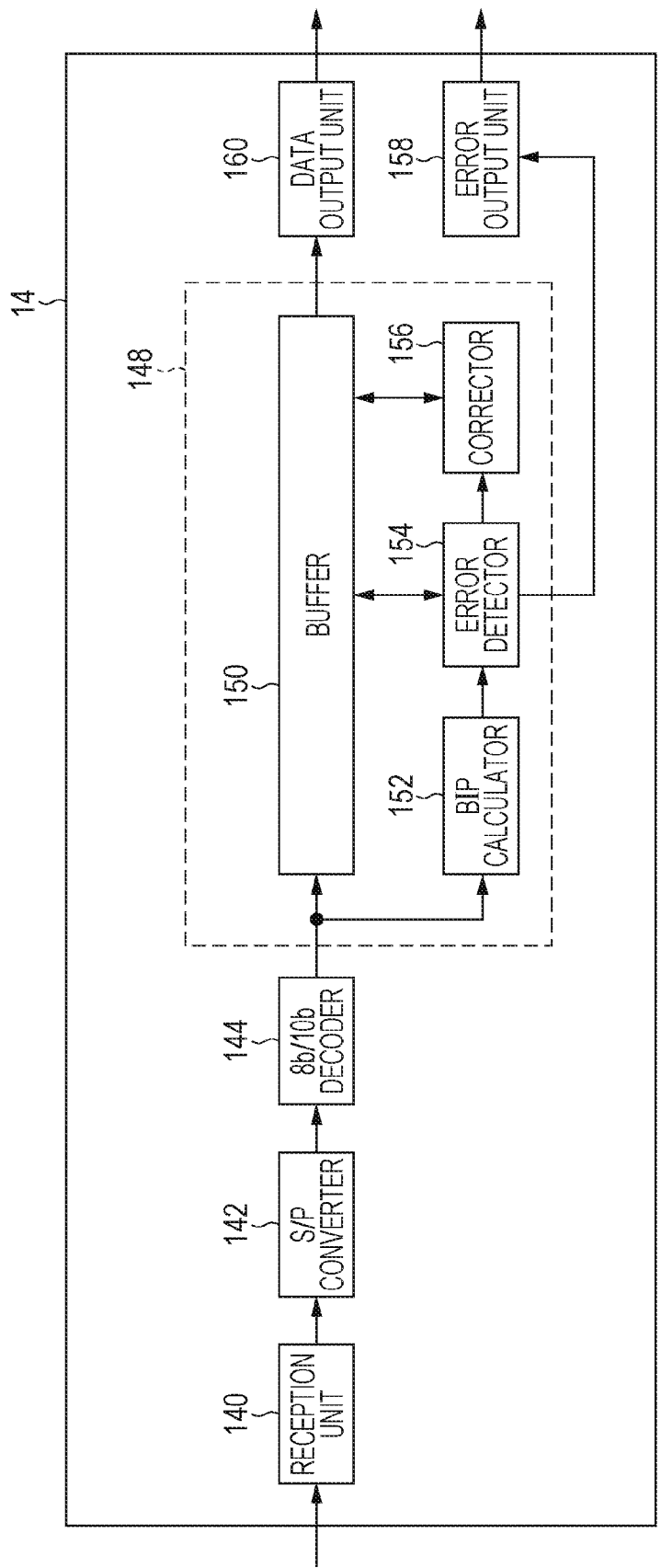
FIG. 6 is a block diagram illustrating an example of a configuration of a decoding device according to the first exemplary embodiment.

Next, a configuration of the decoding device 14 will be described. FIG. 6 is a block diagram illustrating an example of a configuration of a decoding device. As illustrated in FIG. 6, the decoding device 14 is equipped with a reception unit 140, a serial-to-parallel (S/P) converter 142, an 8b/10b decoder 144, an error corrector 148, an error output unit 158, and a data output unit 160. The decoding device 14 is implemented by an integrated circuit (IC) such as a field-programmable gate array (FPGA), an application-specific integrated circuit (ASIC), or a gate array. Also, each of the above functional units provided in the decoding device 14 may also be realized by a computer equipped with a central processing unit (CPU), random access memory (RAM), read-only memory (ROM), and the like, in which each function in each functional unit is configured to be executed by having the CPU execute a program stored in the ROM.

The reception unit 140 receives data in serial format transmitted by the encoding device 12 via the transmission line 16. The data in serial format received by the reception unit 140 is data that has been encoded to maintain DC balance, and is data with parity data attached.

The serial-to-parallel (S/P) converter 142 converts data in serial format received by the reception unit 140 to data in parallel format.

The 8b/10b decoder 144 decodes the data in parallel format obtained by the serial-to-parallel (S/P) converter 142 using a predetermined conversion table in accordance with an 8b/10b coding scheme, and outputs the decoded data as received data and parity data. Additionally, the 8b/10b decoder 144 stores the decoded received data and parity data in a buffer 150 discussed later.

In addition, when a decoding error occurs in the decoding of data output from the serial-to-parallel (S/P) converter 142, the 8b/10b decoder 144 stores information about the decoding error in the buffer 150 discussed later. The information about the decoding error includes the position of the decoding error and the type of the decoding error.

Decoding errors include a Not in Table (NIT) error, which indicates that the data to be decoded by the 8b/10b decoder 144 does not exist in the predetermined conversion table, and a running disparity error (hereinafter called an RD error), which indicates that the running disparity of the data to be decoded by the 8b/10b decoder 144 is not following the rule.

For example, when the current RD is +1, and an "A−" or "B−" symbol is received, an RD error is detected.

Figures 7A, 7B:
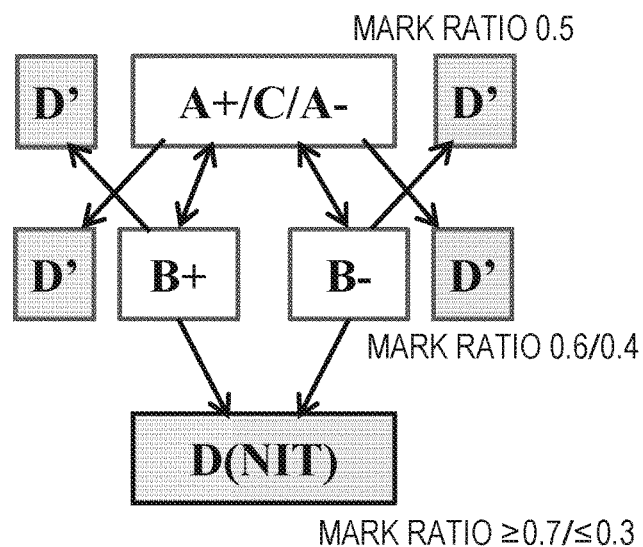
FIGS. 7A and 7B are diagrams illustrating changes in symbols when a 1-bit error occurs, and an example of error detection when 1-bit error occurs.

FIG. 7A illustrates changes in symbols when a 1-bit error occurs. When a 1-bit error occurs, as illustrated in FIG. 7A, an "A+", "C", or "A−" symbol with a mark ratio of 0.5 becomes a symbol with a mark ratio of 0.4 or a mark ratio of 0.6. In other words, when a 1-bit error occurs in "A+", "C", or "A−", that symbol becomes any of "B+", "B−", and "NIT".

Also, when a "B+" or a "B−" symbol with a mark ratio of 0.6 or a mark ratio of 0.4 is transmitted, and a 1-bit error occurs, as illustrated in FIG. 7A, that symbol becomes a symbol with a mark ratio of "0.3", "0.5", or "0.7". In other words, when a 1-bit error occurs in "B+" or "B−", that symbol becomes any of "A+", "C", "A−", and "NIT".

FIG. 7B illustrates a table indicating changes in bits when the above 1-bit error occurs.

The "Table" column in the table illustrated in FIG. 7B represents the presence or absence of a NIT error, in which 0 indicates "no error present", and 1 indicates "NIT error present". Also, the "RD" column represents the presence or absence of an RD error, in which 0 indicates "no error present", and 1 indicates "RD error present". By taking the logical sum of the "Table" column and the "RD" column, the presence or absence of an error is ascertained. As illustrated in FIG. 7B, eight combinations yield "no error", but the RD is different when receiving the next piece of data, resulting in an RD error. However, receiving a "C" symbol when receiving the next piece of data does not result in an RD error.

Next, the cases in which a 1-bit error in each transmitted pattern will be described in detail.

FIG. 8 is a diagram for explaining the case in which a 1-bit error occurs in an "A+" symbol.

As illustrated in FIG. 8, when an "A+" symbol is transmitted and a 1-bit error occurs, the pattern of error in the received data becomes any of the "B−" symbol in the received pattern 1, the "B+" symbol in the received pattern 2, and "NIT".

If "B+" symbol of the received pattern 2 is received, an RD error does not occur, but an RD error occurs when receiving the next piece of data. The transmitting side does not change the RD with an "A+" symbol, but the RD is changed by the "B+" symbol on the receiving side. Accordingly, when transmitting and receiving the next piece of data, a discrepancy occurs in the RD on the transmitting side and the expected RD on the receiving side, and if there are no errors in transmission, an RD error occurs.

In other words, when a 1-bit error occurs once, an RD error occurs for the symbol where the error occurred, or in the symbol received next. Consequently, if the odd-numbered symbols or even-numbered symbols are transmitted with parity bits attached for every packet, 1-bit errors are corrected.

Figure 9:
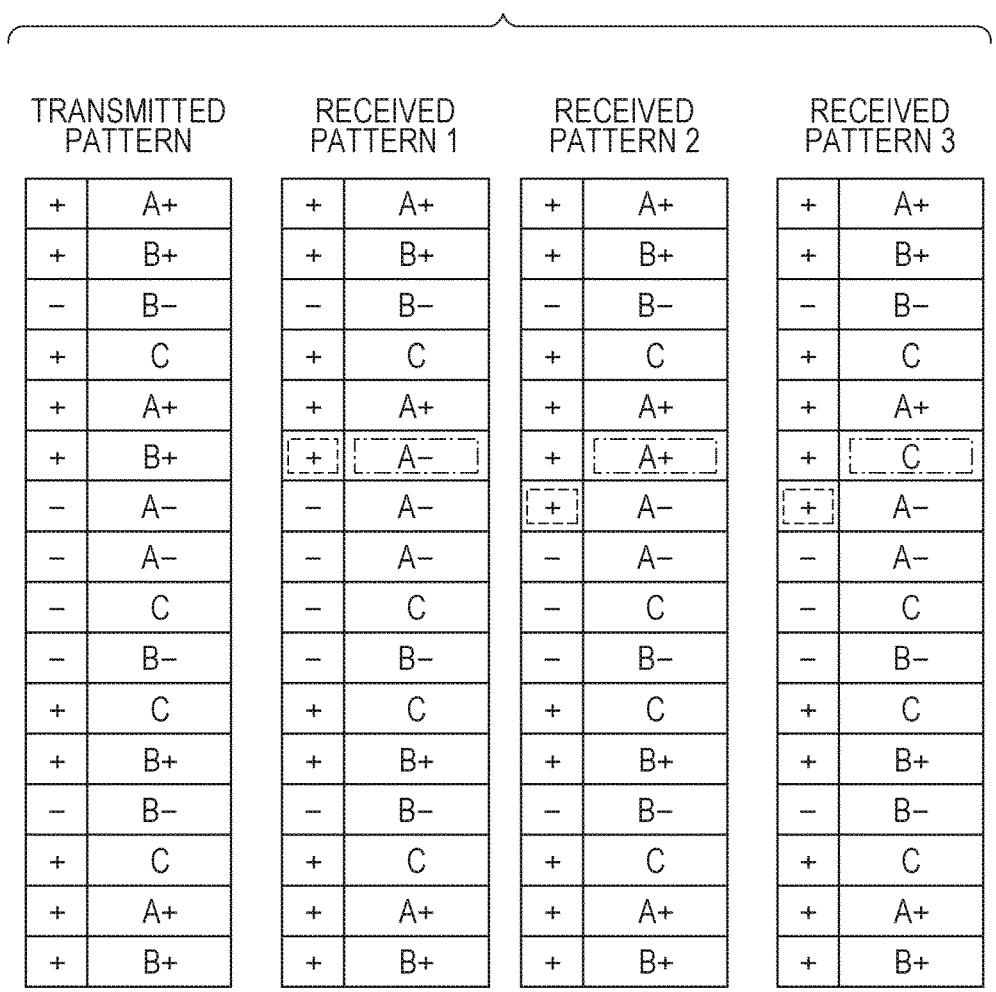
FIG. 9 is a diagram illustrating an example of a case in which a bit error occurs.

FIG. 9 is a diagram for explaining the case in which a 1-bit error occurs in a "B+" symbol.

As illustrated in FIG. 9, when a "B+" symbol is transmitted and a 1-bit error occurs, the pattern of error becomes any of the received pattern 1 having an "A−" symbol, the received pattern 2 having an "A+" symbol, the received pattern 3 having a "C" symbol, and a received pattern in which "NIT" is detected.

As illustrated in FIG. 9, when the "A+" symbol of the received pattern 2 is received or when the "C" symbol of the received pattern 3 is received, an RD error does not occur, but as explained below, an RD error occurs when receiving the next piece of data.

The transmitting side changes the RD with a "B+" symbol, but the RD is not changed by the "A+" symbol or the "C" symbol on the receiving side. Accordingly, when transmitting and receiving the next piece of data, a discrepancy occurs in the RD on the transmitting side and the expected RD on the receiving side, and if there are no errors in transmission, an RD error occurs when receiving the next piece of data. Consequently, if the odd-numbered symbols or even-numbered symbols are transmitted with parity bits attached for every packet, it becomes possible to correct 1-bit errors.

FIG. 10 illustrates a diagram for explaining the case in which an error is not corrected in technology of the related art.

As illustrated in FIG. 10, when the "B−" symbol of the transmitted pattern is transmitted the pattern of error in the received data becomes any of the "A+" symbol in the received pattern 1, the "A−" symbol in the received pattern 2, and "NIT".

As illustrated in FIG. 10, when the "A−" symbol of the received pattern 2 is received, an RD error does not occur, and when the "C" symbol is received next, an RD error still does not occur. An RD error occurs when receiving the "A+" symbol of the next piece of data.

In the received pattern 2, as illustrated in FIG. 10, an error is detected in the 5th symbol even though the error occurred in the 3rd symbol. In other words, an RD error does not occur even though a 1-bit error has occurred, and in addition, in the case of receiving a "C" symbol next, the error location is not specified with just the parity bits of odd-numbered symbols or even-numbered symbols.

Accordingly, in the present exemplary embodiment, errors as illustrated by the received pattern 2 in FIG. 10 are corrected on the basis of the decoding error that occurs when decoding the data, and the parity error detected according to the parity data.

The error corrector 148 is equipped with a buffer 150, a BIP calculator 152, an error detector 154, and a corrector 156.

The buffer 150 stores received data and parity data decoded by the 8b/10b decoder 144, and information about decoding errors.

The BIP calculator 152 acquires transmit data stored in the buffer 150, divides the acquired transmit data into individual sections having a predetermined number of bits, and calculates parity data for each bit position in a section. Additionally, the BIP calculator 152 outputs the calculated parity data to the error detector 154.

The error detector 154 detects parity errors according to the parity data of received data stored in the buffer 150, and the parity data output by the BIP calculator 152. Additionally, the error detector 154 outputs detected parity errors to the corrector 156.

In addition, in the case of detecting, on the basis of the information about decoding errors stored in the buffer 150 and the detected parity errors, decoding errors occurring in two or more places, or a parity error but not a decoding error, the error detector 154 detects errors in two or more bits of the received data, and outputs information indicating that there are errors in two or more bits of the received data to the error output unit 158.

The corrector 156, on the basis of the information about decoding errors stored in the buffer 150 and the parity errors output by the error detector 154, identifies a symbol having a 1-bit error from among the received data stored in the buffer 150 from the combination of the position of the decoding error that occurred during decoding and the position of the parity error.

Subsequently, the corrector 156 computes correction data by taking the XOR of the parity data output by the BIP calculator 152 and the parity data of the received data stored in the buffer 150, and corrects the 1-bit error by taking the XOR of the symbol having the 1-bit error and the correction data.

FIGS. 11A to 11C illustrate diagrams for explaining the correction of a 1-bit error in received data.

A case will be explained in which a transmitted pattern as illustrated in FIG. 11A is encoded by the encoding device 12, and a received pattern as illustrated in FIG. 11B is received by the decoding device 14.

As illustrated in FIG. 11B, when an error occurs in the "B−" symbol in the third column of the first row, an RD error is detected in the "A+" symbol in the first column of the second row, as illustrated in the received pattern of FIG. 10 above. In this case, if the error detector 154 performs a parity data check, P3' becomes a parity error whereas P1 does not become a parity error, as illustrated in FIG. 11C. Consequently, in this case, the corrector 156 judges that an error occurred in the symbol in the third column of the first row, and corrects the 1-bit error in the symbol in the third column of the first row on the basis of the P3' parity data.

FIG. 12 illustrates a specific example of the correction of a 1-bit error in received data. As illustrated in FIG. 12, during the check for decoding errors by the 8b/10b decoder 144, if an RD error occurs when receiving the "A+" symbol, a start address 0x03 and an end address 0x06 are stored in the buffer 150 as the position of the decoding error. In the example illustrated in FIG. 12, the P1 block becomes an error during the check for parity errors by the BIP calculator 152. The number of error places is 1, and thus the corrector 156 corrects the 1-bit error in the "C" symbol, which is the data at 0x04 corresponding to the P1 block from 0x03 to 0x06, on the basis of the P1' parity data.

When the error detector 154 outputs information indicating that there are errors in two or more bits of the received data, the error output unit 158 outputs information indicating that there are errors in two or more bits of the received data.

After error correction ends, including the case in which there are no errors, the data output unit 160 sequentially outputs the received data stored in the buffer 150.

<Operation of Information Transmission System>

Next, operation of the information transmission system 10 will be described. As above, the operation of the information transmission system 10 includes processing on the encoding device 12 side and processing on the decoding device 14 side.

<Processing on Encoding Device Side>

First, the processing executed on the encoding device 12 side will be described.

Figure 13:
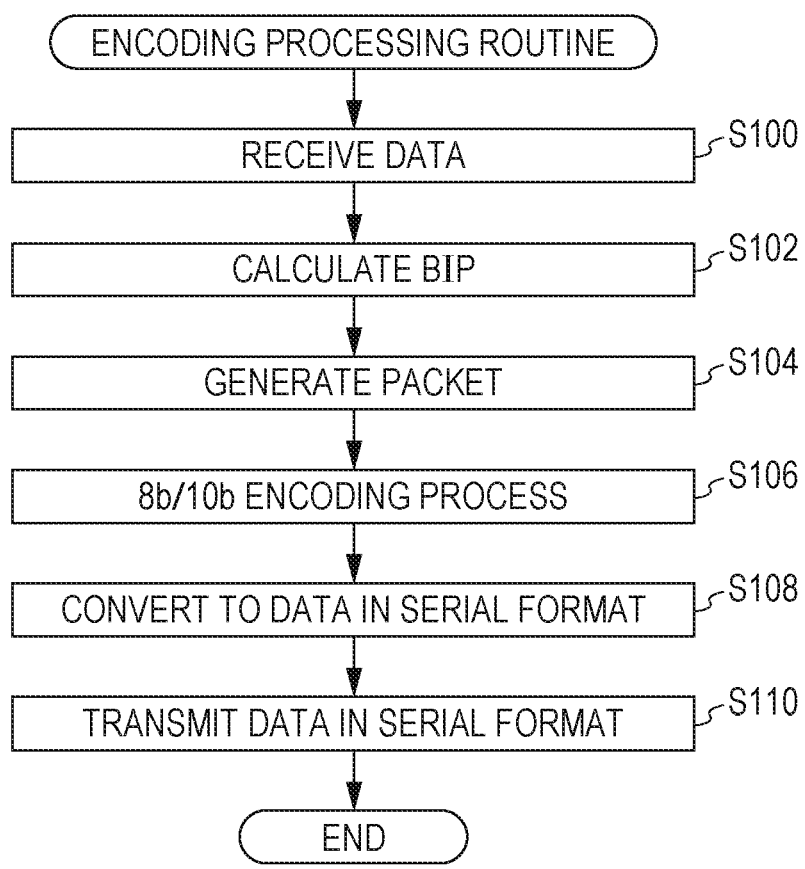
FIG. 13 is a diagram representing the content of an encoding processing routine executed by an encoding device according to the first exemplary embodiment.

FIG. 13 is a flowchart illustrating an example of the sequence of an encoding processing routine executed by the encoding device 12. The encoding device 12 executes the encoding processing routine illustrated in FIG. 13 when data in parallel format to be encoded is input.

In step S100, the data receiver 120 receives transmit data in parallel format.

In step S102, the BIP calculator 124 acquires the transmit data received in the above step S100, divides the acquired transmit data into individual sections having a predetermined number of bits, and calculates parity data for each bit position in a section.

In step S104, the packet generator 126 generates a packet from the transmit data received in the above step S100 and the parity data calculated in the above step S102.

In step S106, the 8b/10b encoder 128 encodes the packet generated in the above step S104 according to an 8b/10b coding scheme, and thereby converts the number of bits.

In step S108, the parallel-to-serial (P/S) converter 130 converts the data in parallel format converted in the above step S106 to a serial bit sequence.

In step S110, the transmission unit 132 outputs the data in serial format converted in the above step S108 to the transmission line 16, and ends the encoding processing routine.

<Processing on Decoding Device Side>

Next, the processing executed on the decoding device 14 side will be described.

Figure 14:
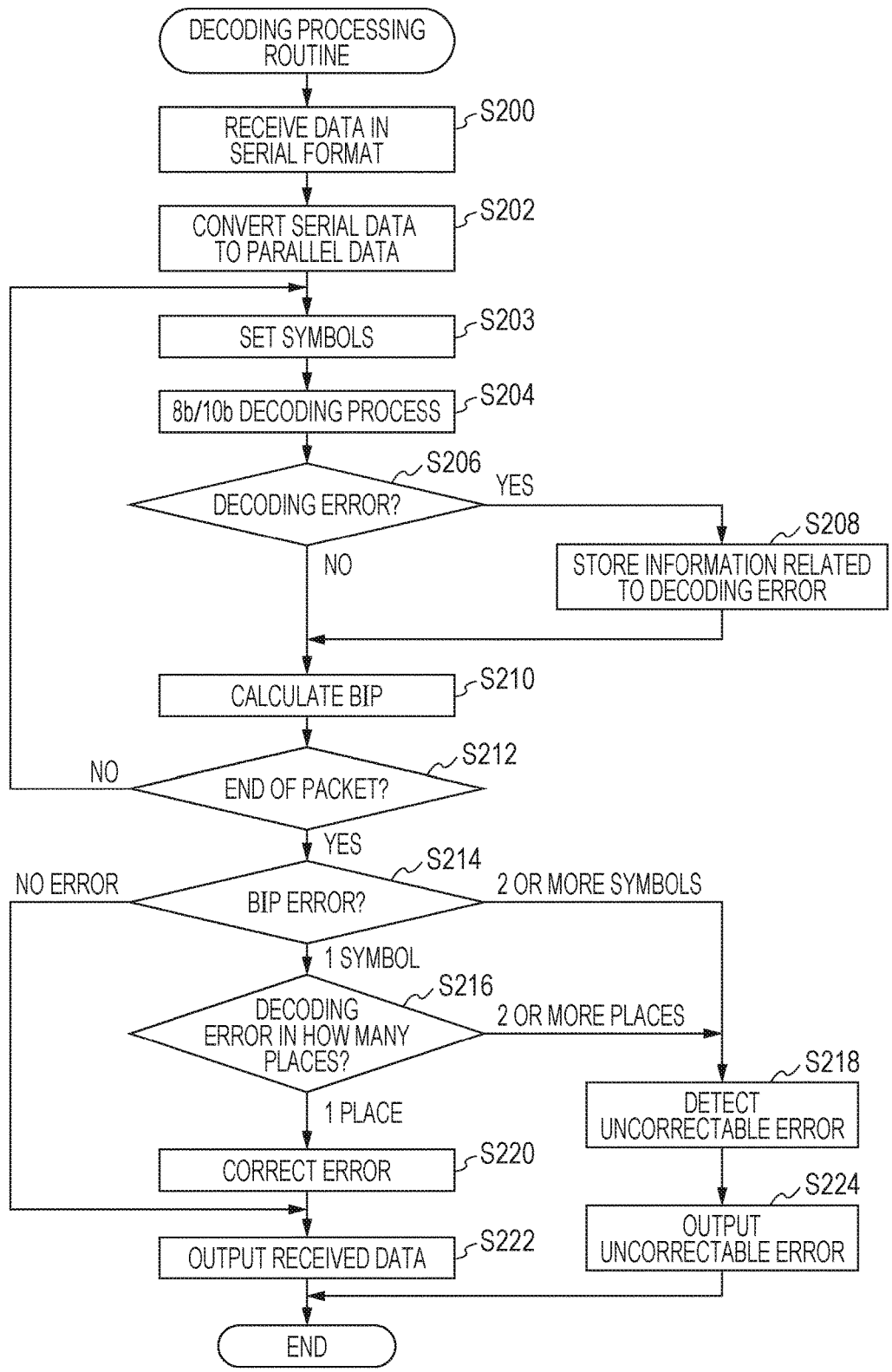
FIG. 14 is a diagram representing the content of a decoding processing routine executed by a decoding device according to the first exemplary embodiment.

FIG. 14 is a flowchart illustrating an example of the sequence of a decoding processing routine executed by the decoding device 14. The decoding device 14 executes the decoding processing routine illustrated in FIG. 14 when data to be decoded is received.

In step S200, the reception unit 140 receives data in serial format transmitted by the encoding device 12 via the transmission line 16.

In step S202, the serial-to-parallel (S/P) converter 142 converts the data in serial format received in the above step S200 to data in parallel format.

In step S203, the 8b/10b decoder 144 configures columns of symbols from the data in parallel format obtained in the above step S202.

In step S204, the 8b/10b decoder 144 decodes the packet configured in the above step S203 according to an 8b/10b coding scheme, and outputs received data and parity data. Additionally, the 8b/10b decoder 144 stores the decoded received data and parity data in the buffer 150.

In step S206, the 8b/10b decoder 144 determines whether or not a decoding error occurred in the decoding of the above step S204. If a decoding error occurred, the process proceeds to step S208. On the other hand, if a decoding error did not occur, the process proceeds to step S210.

In step S208, the 8b/10b decoder 144 stores information about the decoding error that occurred in the decoding of the above step S204 in the buffer 150.

In step S210, the BIP calculator 152 acquires the transmit data stored in the buffer 150 in the above step S204, divides the acquired transmit data into individual sections having a predetermined number of bits, and calculates parity data for each bit position in a section.

In step S212, it is determined whether or not the processing from step S203 to step S210 above has been executed for all symbols in the received data. If the processing from step S203 to step S210 above has been executed for all symbols in the received data, the process proceeds to step S214. On the other hand, if there exists a symbol for which the processing from step S203 to step S210 above has not been executed, the process returns to step S203.

In step S214, the error detector 154 detects whether or not a parity error occurred, according to the parity data of received data stored in the buffer 150, and the parity data calculated in the above step S210. Subsequently, if a parity error occurred in a symbol in one place, the process proceeds to step S216. On the other hand, if parity errors occurred in symbols in two or more places, the process proceeds to step S218. If no parity errors occurred, the process proceeds to step S222.

In step S216, the error detector 154 determines the number of places where a decoding error occurred, according to the information about decoding error stored in the buffer 150 in the above step S208. If there are decoding errors in two or more places, the process proceeds to step S218.

On the other hand, if there is a decoding error in one place, the parity error detected in the above step S214 is output to the corrector 156, and the process proceeds to step S220.

In step S218, the error detector 154 detects an uncorrectable error, which indicates that correction is unavailable, for the received data stored in the buffer 150.

In step S220, a 1-bit error in the received data stored in the buffer 150 is corrected using the information about decoding error stored in the buffer 150 and the parity error output in the above step S216, on the basis of the combination of the position where the decoding error occurred during decoding and the position of the parity error.

In step S222, the data output unit 160 outputs the received data stored in the buffer 150, and ends the decoding processing routine.

In step S224, the error output unit 158 outputs the uncorrectable error detected in the above step S218, and ends the decoding processing routine.

Second Exemplary Embodiment

The first exemplary embodiment describes, as an example, a case in which the decoding device 14 is equipped with a corrector 156, and the corrector 156 corrects a 1-bit error in the received data stored in the buffer 150 on the basis of the combination of the position where the decoding error occurred during decoding and the position of the parity error. In contrast, the second exemplary embodiment describes, as an example, a case in which 1-bit error correction is performed even when "C" symbols are received consecutively. Note that the portions of the configuration which are similar to the encoding device 12 and the decoding device 14 according to the first exemplary embodiment discussed above will be given the same signs as in the first exemplary embodiment, and the description of such portions may be reduced or omitted.

FIGS. 15A to 15C illustrate diagrams for explaining an example of the case in which "C" symbols are received consecutively.

A case will be explained in which a transmitted pattern 1 as illustrated in FIG. 15A is transmitted by the encoding device 12, and a received pattern 2 as illustrated in FIG. 15B is received by the decoding device 14. Also, FIG. 15C illustrates a list of codes for the "C" symbol, which is an example of a specific symbol.

In the first exemplary embodiment above, when "C" symbols are received consecutively, there is a possibility that the error position may not be determined. For example, as illustrated in FIG. 15A, in the case of dividing the transmit data into 4×N symbols, if an RD error is detected after receiving three consecutive "C" symbols, an error is determined to have occurred in the "C" symbol when a parity error occurs in parity other than P3. However, when a parity error occurs in P3, it is not determined whether the error occurred in the first column or the error occurred in the second column.

(Encoding Device 212)

Figure 16:
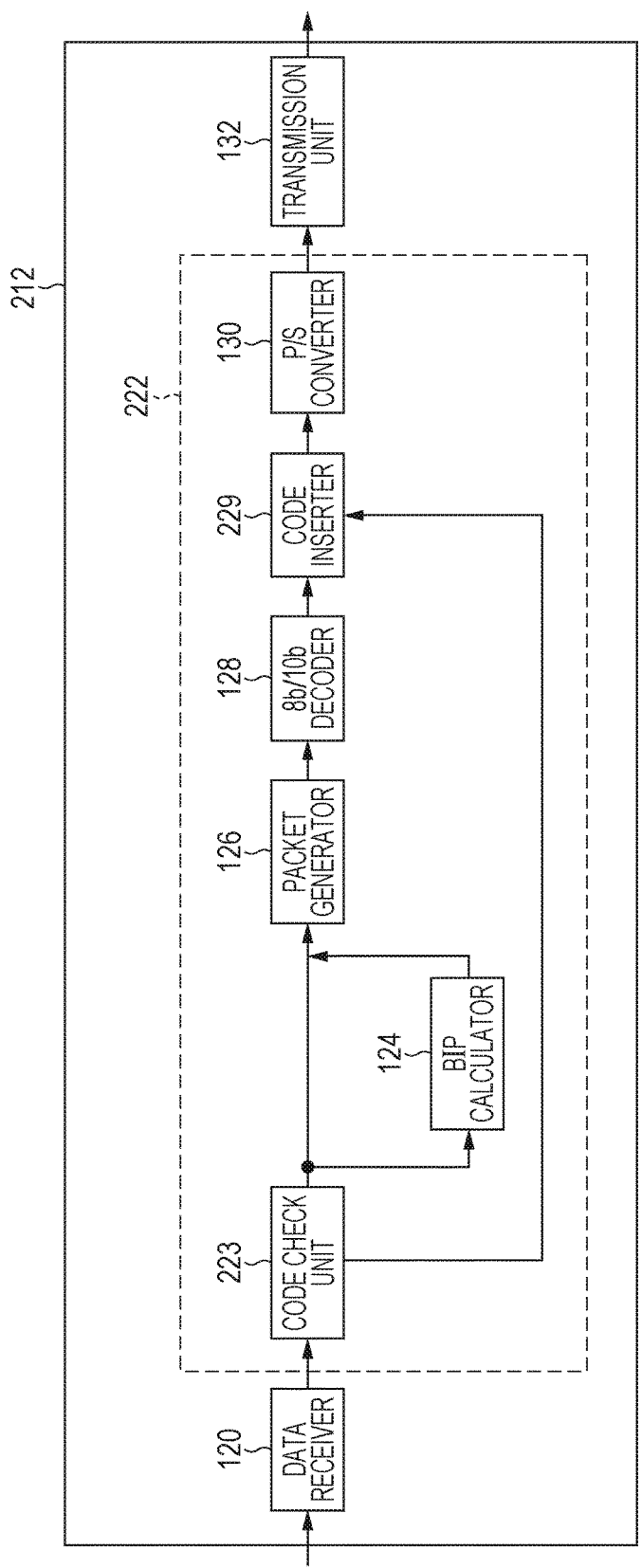
FIG. 16 is a block diagram illustrating an example of a configuration of an encoding device according to a second exemplary embodiment.

FIG. 16 is a block diagram illustrating an example of a configuration of an encoding device 212 according to the second exemplary embodiment. As illustrated in FIG. 2, the encoding device 212 is equipped with a data receiver 120, a converter 222, and a transmission unit 132.

The converter 222 acquires transmit data in parallel format received by the data receiver 120. Subsequently, the converter 222 attaches parity data to the acquired transmit data, and encodes the transmit data so that DC balance is maintained. The converter 222 is equipped with a code check unit 223, a BIP calculator 124, a packet generator 126, an 8b/10b encoder 128, a code inserter 229, and a parallel-to-serial (P/S) converter 130.

The code check unit 223 detects a place having a predetermined number of consecutive "C" symbols in the transmit data in parallel format received by the data receiver 120. In the present exemplary embodiment, the case in which the predetermined number is "3" will be described.

The code inserter 229 inserts a K code, which is an example of a predetermined code, after a place having three consecutive "C" symbols, on the basis of the detection result from the code check unit 223.

Figure 17:
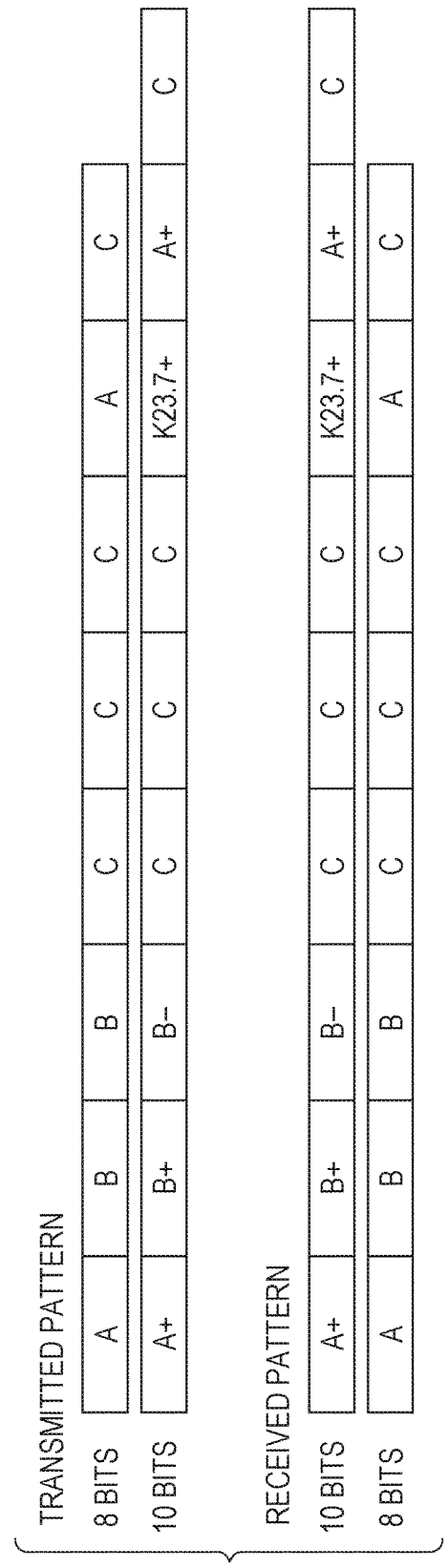
FIG. 17 is a diagram for explaining the insertion and removal of a K code.

FIG. 17 illustrates an example of inserting a K code. As illustrated by the transmitted pattern in FIG. 17, the symbol "K23.7+" expressing a K code is inserted after the place having three consecutive "C" symbols. Also, as illustrated by the received pattern in FIG. 17, the K code is removed in the decoding device discussed later.

(Decoding Device 214)

Figure 18:
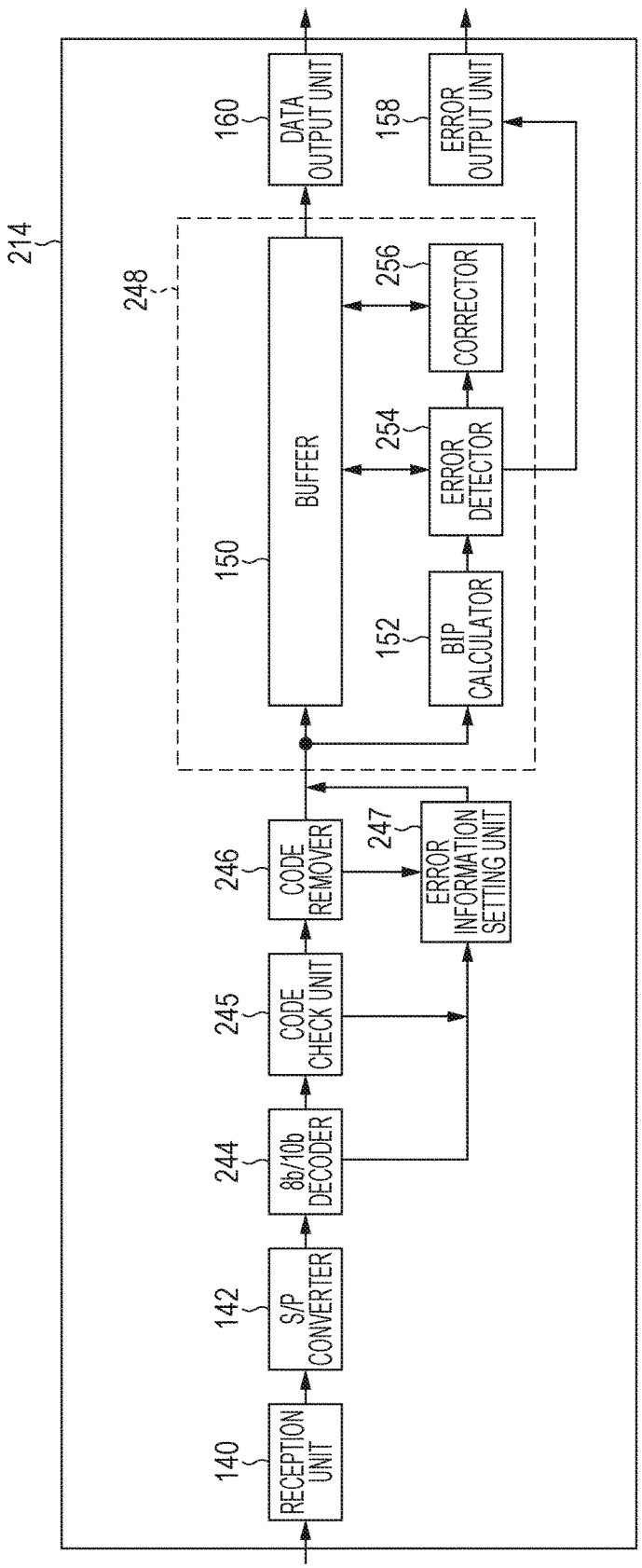
FIG. 18 is a block diagram illustrating an example of a configuration of a decoding device according to the second exemplary embodiment.

FIG. 18 is a block diagram illustrating an example of a configuration of the decoding device 214 according to the second exemplary embodiment. As illustrated in FIG. 18, the decoding device 214 is equipped with a reception unit 140, a serial-to-parallel (S/P) converter 142, an 8b/10b decoder 244, a code check unit 245, a code remover 246, an error information setting unit 247, an error corrector 248, an error output unit 158, and a data output unit 160.

The 8b/10b decoder 244 decodes the data in parallel format obtained by the serial-to-parallel (S/P) converter 142 using a predetermined conversion table in accordance with an 8b/10b coding scheme, and outputs the decoded data as received data and parity data.

In addition, when a decoding error occurs in the decoding of data output from the serial-to-parallel (S/P) converter 142, the 8b/10b decoder 244 outputs information about the decoding error.

The code check unit 245 detects, on the basis of a list of "C" symbols, a place having consecutive "C" symbols in the received data output by the 8b/10b decoder 244.

The code remover 246 removes the K code from the received data output by the 8b/10b decoder 244 on the basis of the place having three consecutive "C" symbols detected by the code check unit 245, and outputs received data with the K code removed. Also, the code remover 246 stores the received data with the K code removed in the buffer 150.

The error information setting unit 247 sets error information according to a predetermined rule, on the basis of the information about decoding error output by the 8b/10b decoder 244, the number of consecutive "C" symbols in the place having consecutive "C" symbols detected by the code check unit 245, and the received data with the K code removed by the code remover 246.

FIGS. 19 to 22 illustrate examples of the setting of error information by the error information setting unit 247.

FIG. 19 illustrates the case in which an RD error occurs in the "K23.7+" symbol of the K code after three consecutive "C" symbols.

As illustrated in the example of FIG. 19, when the "B−" symbol is transmitted in the transmitted pattern, a 1-bit error occurs, the "A−" symbol is received on the receiving side, and three consecutive "C" symbols follow after the "A−" symbol, an RD error occurs in the "K23.7+" symbol of the K code.

When there are three consecutive "C" symbols and an RD error occurs in the K code as the decoding error, as illustrated in FIG. 19 above, the error information setting unit 247 sets error information in the "C" symbol one symbol behind the "K23.7" symbol of the K code.

Next, FIG. 20 illustrates the case in which an NIT error occurs in the symbol after three consecutive "C" symbols.

As illustrated in the example of FIG. 20, when a 1-bit error occurs in the "K23.7+" symbol of the K code, an NIT error occurs in the symbol after the three consecutive "C" symbols.

When an NIT error occurs as the decoding error in the symbol after three consecutive "C" symbols, as illustrated in FIG. 20 above, the error information setting unit 247 sets error information in the "C" symbol one symbol behind the symbol in which the NIT error occurred.

Next, FIGS. 21A and 21B illustrate the case in which an "A" symbol or a "B" symbol appears after three consecutive "C" symbols.

As illustrated in the example of FIG. 21A, when a pattern of a "C" symbol, a "B" symbol, and a "C" symbol is transmitted on the transmitting side, but a "C" symbol, a "C" symbol, and a "C" symbol are received on the receiving side, an RD error occurs when receiving the "A−" symbol after the three consecutive "C" symbols.

When an RD error occurs in the "A−" symbol after three consecutive "C" symbols, as illustrated in FIG. 21A above, the error information setting unit 247 sets error information in the "A" symbol.

Also, as illustrated in the example of FIG. 21B, when a pattern of a "C" symbol, a "B" symbol, and a "C" symbol is transmitted on the transmitting side, but a "C" symbol, a "C" symbol, and a "C" symbol are received on the receiving side, an RD error occurs in the "B−" symbol after the three consecutive "C" symbols.

When an RD error occurs in the "B−" symbol after three consecutive "C" symbols, as illustrated in FIG. 21A above, the error information setting unit 247 sets error information in the "B" symbol.

Figure 22:
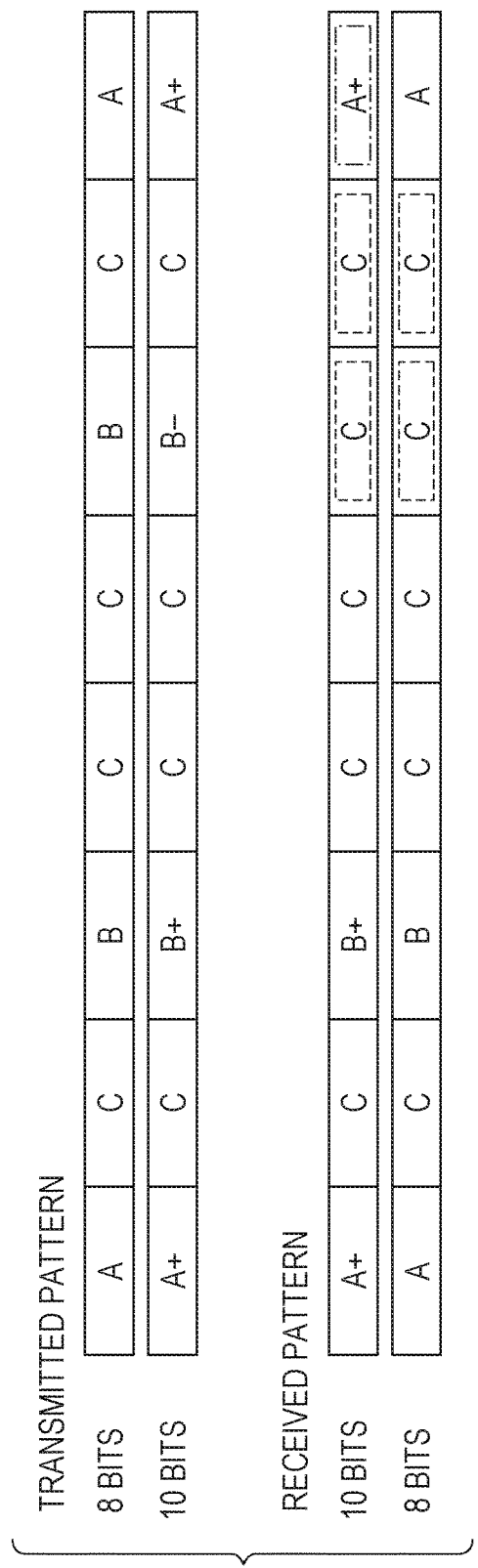
FIG. 22 is a diagram illustrating an example of a case in which there are four consecutive "C" symbols.

Next, FIG. 22 illustrates an example of the case in which a transmitted pattern including a "C" symbol, a "C" symbol, a "B" symbol, and a "C" symbol is transmitted, a 1-bit error occurs in the third "C" symbol, and a pattern including a "C" symbol, a "C" symbol, a "C" symbol, and a "C" symbol is received.

As illustrated in the example of FIG. 22, since a K code is inserted when there are three consecutive "C" symbols on the transmitting side, receiving four consecutive "C" symbols on the receiving side is considered to be incorrect, and an error is considered to have occurred in one of the four "C" symbols.

When there are four consecutive "C" symbols as illustrated in FIG. 22 above, the error information setting unit 247 sets error information in the fourth "C" symbol.

Subsequently, the error information setting unit 247 stores the set error information in the buffer 150.

The error detector 254 detects parity errors according to the parity data of received data stored in the buffer 150, and the parity data output by the BIP calculator 152. Additionally, the error detector 254 outputs detected parity errors to the corrector 156.

In addition, the error detector 254 detects the position of an error on the basis of error information stored in the buffer 150 and detected parity error.

For example, when an RD error occurs in the "K23.7+" symbol of the K code after three consecutive "C" symbols as illustrated in FIG. 19 above, the error detector 254 detects that an error occurred in the "A" symbol three symbols behind the "C" symbol one symbol behind the "K23.7" symbol of the K code, as illustrated in the received pattern.

Also, when an NIT error occurs in the symbol after three consecutive "C" symbols, but a parity error is not detected on the basis of the error information stored in the buffer 150 and the detected parity error, as illustrated in FIG. 20 above, the error detector 254 determines that there is no error, as illustrated in the received pattern in FIG. 20 above.

Also, when an "A" symbol or a "B" symbol appears after three consecutive "C" symbols and a parity error is detected on the basis of the error information stored in the buffer 150 and the detected parity error, as illustrated in FIGS. 21A and 21B above, the error detector 254 detects that an error occurred in the "C" two symbols behind the "A" symbol or the "B" symbol, as illustrated in the received pattern in FIGS. 21A and 21B above.

Also, when there are four consecutive "C" symbols and a parity error is detected on the basis of the error information stored in the buffer 150 and the detected parity error, as illustrated in FIG. 22 above, the error detector 254 detects that an error occurred in the third "C", as illustrated in the received pattern in FIG. 22 above.

In addition, in the case of detecting, on the basis of the error information stored in the buffer 150 and the detected parity errors, decoding errors occurring in two or more places, or a parity error but not a decoding error, the error detector 254 detects errors in two or more bits of the received data, and outputs information indicating that there are errors in two or more bits of the received data to the error output unit 158.

The corrector 256, on the basis of the error information stored in the buffer 150 and the parity error output by the error detector 254, corrects the 1-bit error in the received data stored in the buffer 150, on the basis of the combination of the position of the decoding error that occurred during decoding and the position of the parity error.

<Operation of Information Transmission System>

Next, operation of the information transmission system according to the second exemplary embodiment will be described. As above, the operation of the information transmission system according to the second exemplary embodiment is executed on the encoding device 212 side and the decoding device 214 side.

<Processing on Encoding Device Side>

First, the processing executed on the encoding device 212 side will be described.

Figure 23:
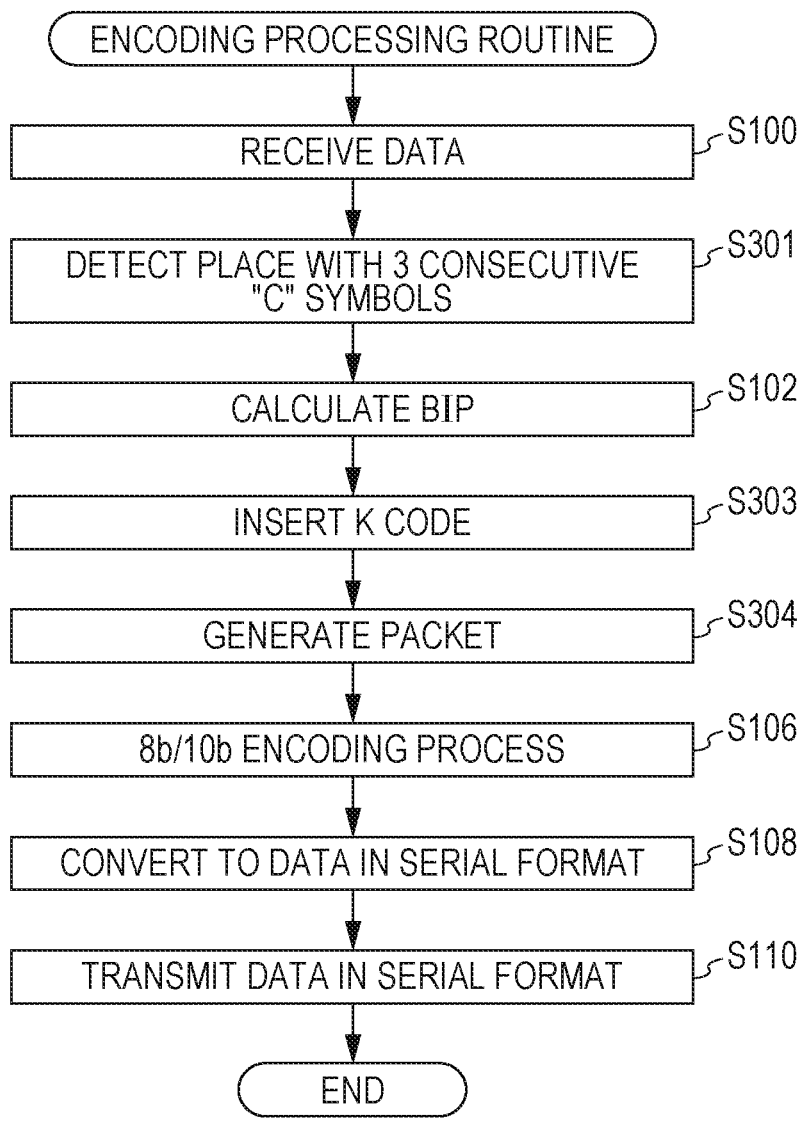
FIG. 23 is a diagram representing the content of an encoding processing routine executed by an encoding device according to the second exemplary embodiment.

FIG. 23 is a flowchart illustrating an example of the sequence of an encoding processing routine executed by the encoding device 212. The encoding device 212 executes the encoding processing routine illustrated in FIG. 23 when transmit data in parallel format to be encoded is input.

In step S100, the data receiver 120 receives transmit data in parallel format.

In step S301, the code check unit 223 detects a place having three consecutive "C" symbols in the transmit data received in the above step S100.

In step S102, the BIP calculator 124 acquires the transmit data received in the above step S100, divides the acquired transmit data into individual sections having a predetermined number of bits, and calculates parity data for each bit position in a section.

In step S303, the code inserter 229 inserts a symbol corresponding to a K code after a place having three consecutive "C" symbols, on the basis of the detection result in the above step S301.

In step S304, the packet generator 126 generates a packet from the transmit data obtained in the above step S303 and the parity data calculated in the above step S102.

In step S106, the 8b/10b encoder 128 encodes the packet generated in the above step S304 according to an 8b/10b coding scheme, and thereby converts the number of bits.

In step S108, the parallel-to-serial (P/S) converter 130 converts the data in parallel format converted in the above step S106 to a serial bit sequence.

In step S110, the transmission unit 132 outputs the data in serial format converted in the above step S108 to the transmission line 16, and ends the encoding processing routine.

<Processing on Decoding Device Side>

Next, the processing executed on the decoding device 214 side will be described.

Figure 24:
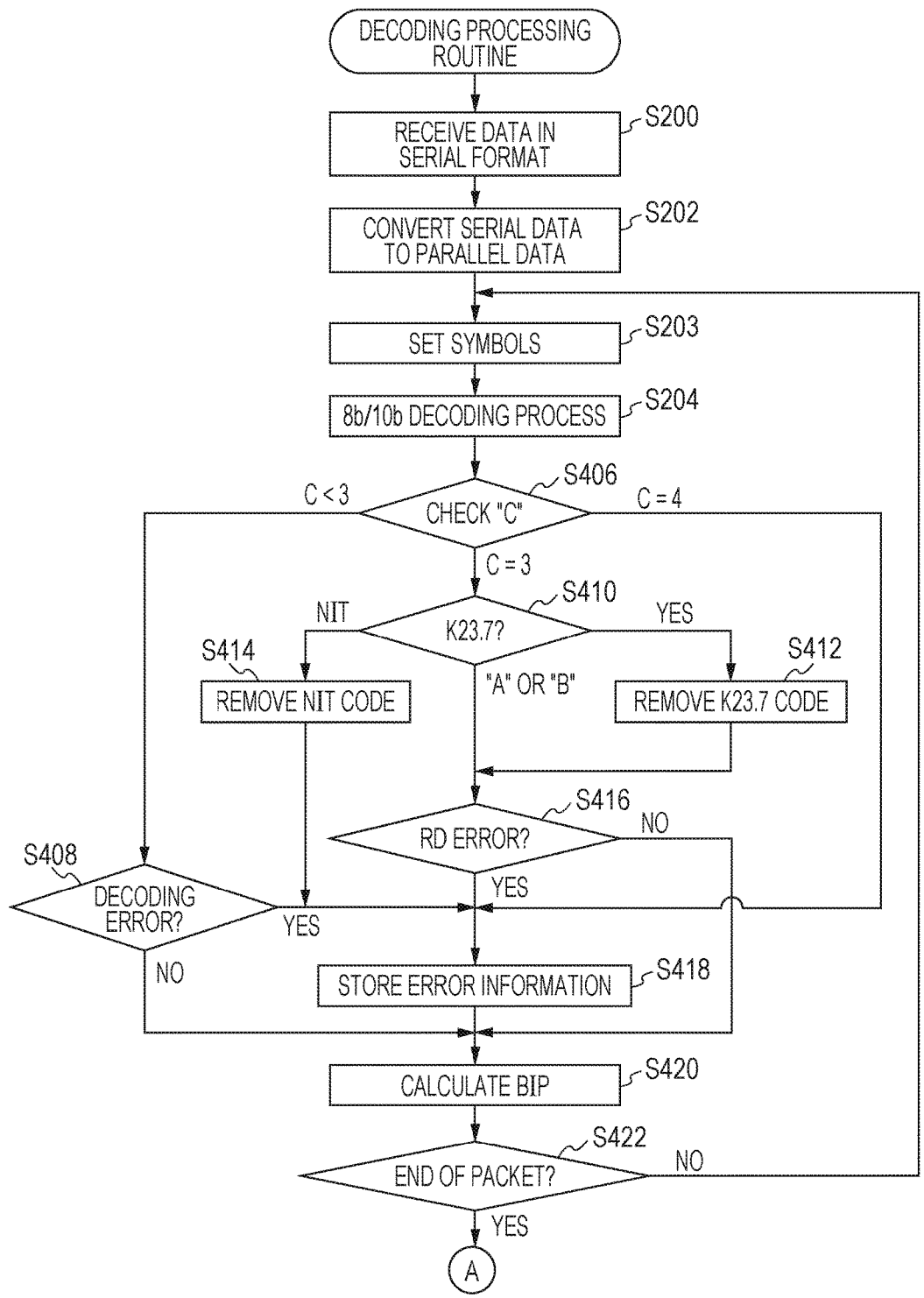
FIG. 24 is a diagram representing the content of a decoding processing routine executed by a decoding device according to the second exemplary embodiment.
Figure 25:
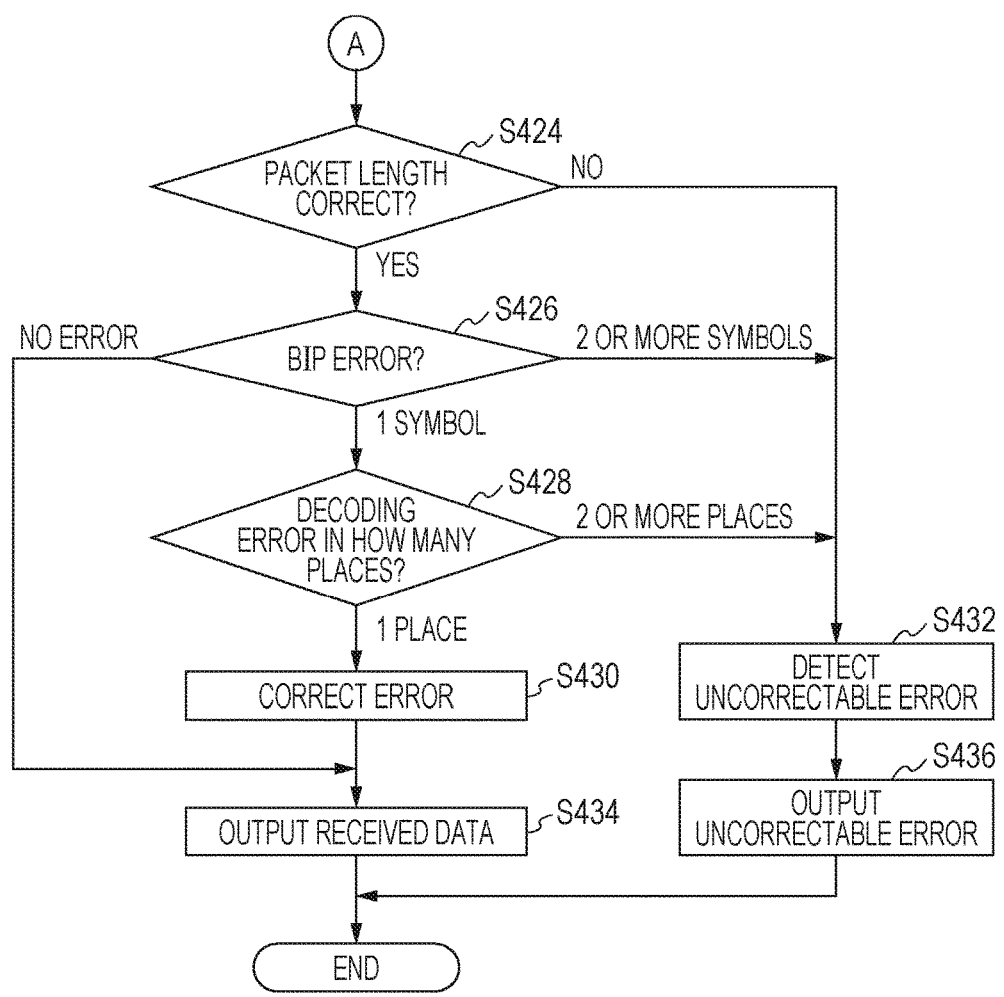
FIG. 25 is a diagram representing the content of a decoding processing routine executed by a decoding device according to the second exemplary embodiment.

FIGS. 24 and 25 are flowcharts illustrating an example of the sequence of a decoding processing routine executed by the decoding device 214. The decoding device 214 executes the decoding processing routine illustrated in FIGS. 24 and 25 when data to be decoded is received.

In step S200, the reception unit 140 receives data in serial format transmitted by the encoding device 12 via the transmission line 16.

In step S202, the serial-to-parallel (S/P) converter 142 converts the data in serial format received in the above step S200 to data in parallel format.

In step S203, the 8b/10b decoder 244 configures columns of symbols from the data in parallel format obtained in the above step S202.

In step S204, the 8b/10b decoder 244 decodes the packet configured in the above step S203 according to an 8b/10b coding scheme, and outputs received data and parity data.

In step S406, the code check unit 245 detects a place in which "C" symbols appear consecutively, on the basis of the received data output in the above step S204. In the case of detecting a place in which less than three "C" symbols appear consecutively, the process proceeds to step S408. On the other hand, in the case of detecting a place in which three "C" symbols appear consecutively, the process proceeds to step S410. Also, in the case of detecting a place in which four "C" symbols appear consecutively, the process proceeds to step S418.

In step S408, the 8b/10b decoder 244 determines whether or not a decoding error occurred in the decoding process in the above step S204. If a decoding error occurred, the process proceeds to step S418. On the other hand, if a decoding error did not occur, the process proceeds to step S420.

In step S410, the code remover 246 determines whether or not the symbol following the appearance of three consecutive "C" symbols is the "K23.7" symbol expressing a K code. In the case of the "K23.7" symbol expressing a K code, the process proceeds to step S412. On the other hand, if the symbol following the appearance of three consecutive "C" symbols is an NIT symbol expressing a code that does not exist in the conversion table, the process proceeds to step S414. Also, if the symbol following the appearance of three consecutive "C" symbols is an "A" symbol or a "B" symbol, the process proceeds to step S416.

In step S412, the code remover 246 removes the K code from the received data output in the above step S204, and outputs received data with the K code removed.

In step S414, the code remover 246 removes the NIT symbol from the received data output in the above step S204, and outputs received data with the NIT symbol removed.

In step S416, the 8b/10b decoder 244 determines whether or not an RD error occurred in the decoding process in the above step S204. If an RD error occurred, the process proceeds to step S418. On the other hand, if an RD error did not occur, the process proceeds to step S420.

In step S418, the error information setting unit 247 causes error information to be stored in accordance with a predetermined rule, according to the information about the place in which "C" symbols appeared consecutively as detected in the above step S406, information about the code following the appearance of the consecutive "C" symbols, and information about decoding error output in the above step S408 or the above step S416.

Specifically, if less than three "C" symbols appeared consecutively in the above step S406, and a decoding error was detected in the above step S408, the error information setting unit 247 causes the buffer 150 to store the position of the decoding error detected in the above step S408 as error information.

Also, if three "C" symbols appeared consecutively in the above step S406, the symbol following the appearance of three consecutive "C" symbols is the "K23.7" symbol expressing a K code in the above step S410, and an RD error occurred in the "K23.7" symbol expressing a K code, the error information setting unit 247 sets the third "C" symbol as the place where the RD error occurred, and causes the buffer 150 to store this information as error information.

Also, if three "C" symbols appeared consecutively in the above step S406, and the symbol following the appearance of three consecutive "C" symbols is a code that does not exist in the conversion table in the above step S410, the error information setting unit 247 sets the third "C" symbol as the place where the RD error occurred, and causes the buffer 150 to store this information as error information.

Also, if three "C" symbols appeared consecutively in the above step S406, the symbol following the appearance of three consecutive "C" symbols is an "A" symbol or a "B" symbol in the above step S410, and an RD error occurred in that "A" symbol or "B" symbol, the error information setting unit 247 sets the "A" symbol or the "B" symbol following the appearance of three consecutive "C" symbol as the place where the RD error occurred, and causes the buffer 150 to store this information as error information.

Also, if four "C" symbols appeared consecutively in the above step S406, the error information setting unit 247 sets the fourth "C" symbol as the place where the RD error occurred, and causes the buffer 150 to store this information as error information.

In step S420, the BIP calculator 152 acquires the transmit data stored in the buffer 150 in the above step S204, divides the acquired transmit data into individual sections having a predetermined number of bits, and calculates parity data for each bit position in a section.

In step S422, it is determined whether or not the processing from step S203 to step S420 above has been executed for all symbols in the received data. If the processing from step S203 to step S420 above has been executed for all symbols in the received data, the process proceeds to step S424. On the other hand, if there exists a symbol for which the processing from step S203 to step S420 above has not been executed, the process returns to step S203.

In step S424, it is determined whether or not the packet length of the received data is correct. If the packet length is correct, the process proceeds to step S426. On the other hand, if the packet length is incorrect, the process proceeds to step S432.

In step S426, the error detector 254 detects whether or not a parity error occurred, according to the parity data of received data stored in the buffer 150, and the parity data calculated in the above step S420. Subsequently, if a parity error occurred in a symbol in one place, the process proceeds to step S428. On the other hand, if parity errors occurred in symbols in two or more places, the process proceeds to step S432. If no parity errors occurred, the process proceeds to step S434.

In step S428, the error detector 254 determines the number of places where a decoding error occurred, according to the error information stored in the buffer 150 in the above step S418. If there are decoding errors in two or more symbols, the process proceeds to step S432.

On the other hand, if there is a decoding error in one symbol, the parity error detected in the above step S426 is output to the corrector 256, and the process proceeds to step S430.

In step S432, the error detector 254 detects an uncorrectable error, which indicates that correction is unavailable, for the received data stored in the buffer 150.

In step S430, the corrector 256 corrects a 1-bit error in the received data stored in the buffer 150 according to the error information stored in the buffer 150 and the parity error output in the above step S426, on the basis of the combination of the position where the decoding error occurred during decoding and the position of the parity error.

In step S434, the data output unit 160 outputs the received data stored in the buffer 150, and ends the decoding processing routine.

In step S436, the error output unit 158 outputs the uncorrectable error detected in the above step S432, and ends the decoding processing routine.

Note that the configurations of an information transmission system described in the foregoing exemplary embodiments are examples, and that obviously these configurations may also be modified within a scope that does not depart from the gist of the present invention. For example, although the information transmission system is described as including an encoding device and a decoding device, the information transmission system may also be one including devices equipped with both an encoding unit and a decoding unit, in which serial transmission is performed between devices. In addition, the bit number conversion may be not only 8b/10b but also a conversion so that the difference in the number of 1s and 0s becomes +2/0/−2. The RD polarity is changed by sending a code with a −2 difference in the number of 1s and 0s when the RD is positive, and sending a code with a +2 difference in the number of 1s and 0s when the RD is negative. In the case of sending a code with a difference of 0 between the 1s and 0s, the RD is not changed. By performing control in this way, bit number conversion like 10b/12b is possible.

In addition, the foregoing exemplary embodiments describe, as an example, the case of segmenting acquired transmit data into multiples of 8 bits and calculating parity data for each bit position in a segment according to a bit-interleaved parity (BIP) scheme. However, the foregoing exemplary embodiments are not limited thereto, and may also segment the transmit data in multiples of a predetermined number of bits and calculate parity data for each bit position in a segment according to some other method. For example, in the case of bit number conversion like 10b/12b, transmit data may be segmented in multiples of 10 bits, and parity data may be calculated for each bit position in a segment.

In addition, the foregoing first exemplary embodiment describes, as an example, the case of dividing the transmit data into 4×N symbols, but the number of divisions, that is, the number of symbols included on each row, may also be increased. In the case of increasing the number of divisions, a 1-bit error is corrected if the number of consecutive "C" symbols is less than or equal to the number of divisions minus one. As illustrated in FIG. 15C above, since there are various codes for "C" symbols, the number of divisions may be increased and a 1-bit error may be corrected if the number of consecutive "C" symbols is less than or equal to the number of divisions minus one.

The present invention obviously may be provided via a communication medium, and may also be provided by being stored on a recording medium such as CD-ROM.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A decoding device comprising at least one microprocessor configured to:
   receive data obtained by segmenting transmit data into multiples of a predetermined number of bits, calculate parity data for each bit position in a segment, attach the parity data to the transmit data, and perform bit number conversion coding on the transmit data so that a ratio of a frequency of occurrence of a first code and a frequency of occurrence of a second code becomes a predetermined ratio; and
   correct a 1-bit error in the received data on a basis of a decoding error occurring in the bit number conversion coding performed on the data received by the reception unit, and a parity error detected according to the parity data from the received data obtained by decoding the data,
   wherein the at least one microprocessor corrects the 1-bit error by XORing calculated parity data and the parity data of the received data.

2. The decoding device according to claim 1, wherein the at least one microprocessor is further configured to:
   detect an error of two bits or more in the received data if the decoding error occurs in symbols in two or more places, or if the decoding error does not occur but a parity error is detected.

3. The decoding device according to claim 1, wherein
   the at least one microprocessor receives the data with a predetermined code inserted after a consecutive appearance of a predetermined number of a specific symbol, and
   corrects a 1-bit error on a basis of a position at which the predetermined code is inserted into the data, the parity error, and the decoding error.

4. The decoding device according to claim 2, wherein
   the at least one microprocessor receives the data with a predetermined code inserted after a consecutive appearance of a predetermined number of a specific symbol, and
   corrects a 1-bit error on a basis of a position at which the predetermined code is inserted into the data, the parity error, and the decoding error.

5. An information transmission system comprising:
   an encoding device including at least one microprocessor configured to:
      obtain data by segmenting transmit data into multiples of a predetermined number of bits, calculate parity data for each bit position in a segment, attach the parity data to the transmit data, and perform bit number conversion coding on the transmit data so that a ratio of a frequency of occurrence of a first code and a frequency of occurrence of a second code is maintained at a predetermined ratio, and
   transmit the data on which bit number conversion coding has been performed; and
   the decoding device according to claim 1.

6. An information transmission system comprising:
   an encoding device including at least one microprocessor configured to:
      obtain data by segmenting transmit data into multiples of a predetermined number of bits, calculate parity data for each bit position in a segment, attach the parity data to the transmit data, insert a predetermined code after a consecutive appearance of a predetermined number of a specific symbol, and perform bit number conversion coding on the transmit data so that a ratio of a frequency of occurrence of a first code and a frequency of occurrence of a second code is maintained at a predetermined ratio, and
   transmit the data on which bit number conversion coding has been performed; and
   the decoding device according to claim 3.

7. A decoding method comprising:
   receiving data obtained by segmenting transmit data into multiples of a predetermined number of bits, calculating parity data for each bit position in a segment, attaching the parity data to the transmit data, and performing bit number conversion coding on the transmit data so that a ratio of a frequency of occurrence of a first code and a frequency of occurrence of a second code becomes a predetermined ratio; and
   correcting a 1-bit error in the received data on a basis of a decoding error occurring in the bit number conversion coding performed on the received data, and a parity error detected according to the parity data from the received data obtained by decoding the data,
   wherein the 1-bit error is corrected by XORing calculated parity data and the parity data of the received data.

8. A non-transitory computer readable medium storing a program causing a computer to perform a process, the process comprising:
   receiving data obtained by segmenting transmit data into multiples of a predetermined number of bits, calculating parity data for each bit position in a segment, attaching the parity data to the transmit data, and performing bit number conversion coding on the transmit data so that a ratio of a frequency of occurrence of a first code and a frequency of occurrence of a second code becomes a predetermined ratio; and
   correcting a 1-bit error in the received data on a basis of a decoding error occurring in the bit number conversion coding performed on the received data, and a parity error detected according to the parity data from the received data obtained by decoding the data,
   wherein the 1-bit error is corrected by XORing calculated parity data and the parity data of the received data.

* * * * *